(12) United States Patent
Hegde

(10) Patent No.: US 6,789,610 B1
(45) Date of Patent: Sep. 14, 2004

(54) HIGH PERFORMANCE COOLING DEVICE WITH VAPOR CHAMBER

(75) Inventor: Shankar Hegde, Annassandrapalya Bangalore (IN)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/651,129

(22) Filed: Aug. 28, 2003

(51) Int. Cl.$^7$ .............................................. F28D 15/00
(52) U.S. Cl. ............................. 165/104.21; 165/104.33; 165/80.4; 361/700; 257/715; 257/716; 174/15.2
(58) Field of Search ........................ 165/104.21, 104.33, 165/80.4, 185, 104.26; 361/699, 700; 257/714–716; 174/15.2, 15.1

(56) References Cited

U.S. PATENT DOCUMENTS

| | | | |
|---|---|---|---|
| 3,613,773 A | * 10/1971 | Hall et al. ................... | 165/273 |
| D464,938 S | 10/2002 | Hegde | |
| 6,505,680 B1 | 1/2003 | Hegde | |
| 6,508,300 B1 | 1/2003 | Hegde | |
| D471,523 S | 3/2003 | Hegde | |
| D471,881 S | 3/2003 | Hegde | |
| 6,543,522 B1 | 4/2003 | Hegde | |
| 6,588,498 B1 | * 7/2003 | Reyzin et al. ......... | 165/104.33 |
| 6,631,756 B1 | * 10/2003 | Hegde ........................ | 165/80.3 |
| 6,725,909 B1 | * 4/2004 | Luo ....................... | 165/104.21 |
| 2001/0050164 A1 | * 12/2001 | Wagner et al. ......... | 165/104.33 |
| 2004/0011508 A1 | * 1/2004 | Tan et al. ................... | 165/80.3 |
| 2004/0016532 A1 | * 1/2004 | Wagner ...................... | 165/80.3 |

* cited by examiner

Primary Examiner—Terrell McKinnon
(74) Attorney, Agent, or Firm—Trueman H. Denny, III

(57) ABSTRACT

A low-cost, fan assisting cooling device is disclosed and includes a heat mass, a thermal core, a vapor chamber, and a phase change liquid sealed in the vapor chamber at a low pressure. Waste heat in the thermal core boils the phase change liquid and converts it into a vapor that rises to contact surfaces of the vapor chamber where it is cooled down and converted back into the phase change liquid. A plurality of vanes and fins are connected with the heat mass and an air flow over the vanes and fins dissipates heat from the heat mass. Consequently, the heat mass is convection cooled by the air flow and evaporatively cooled by the boiling of the phase change liquid.

31 Claims, 28 Drawing Sheets

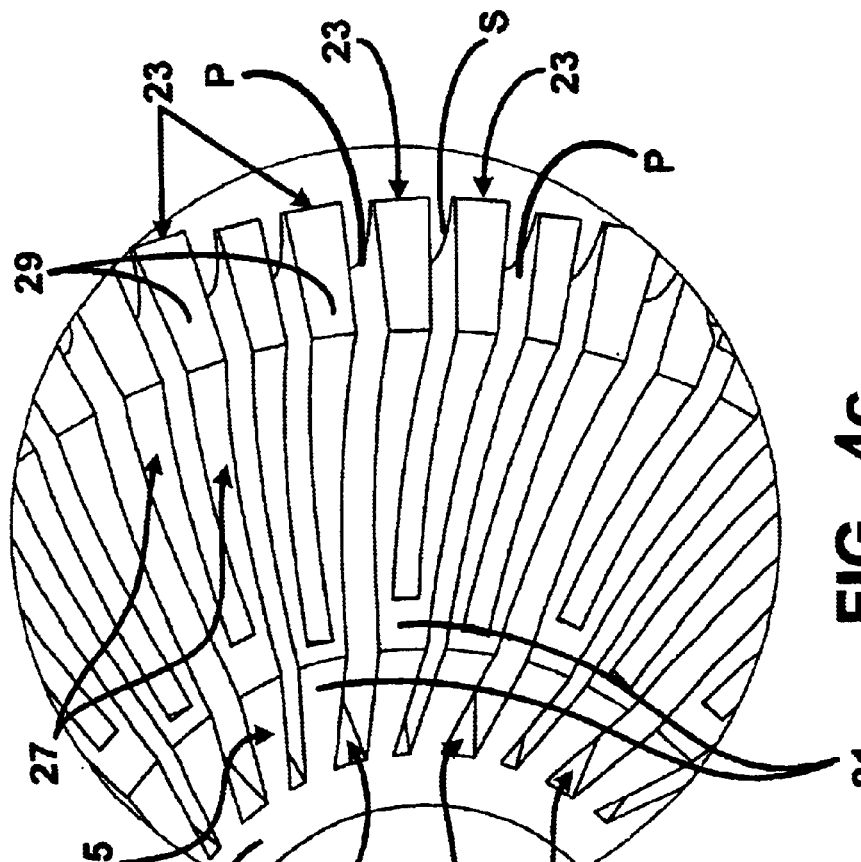
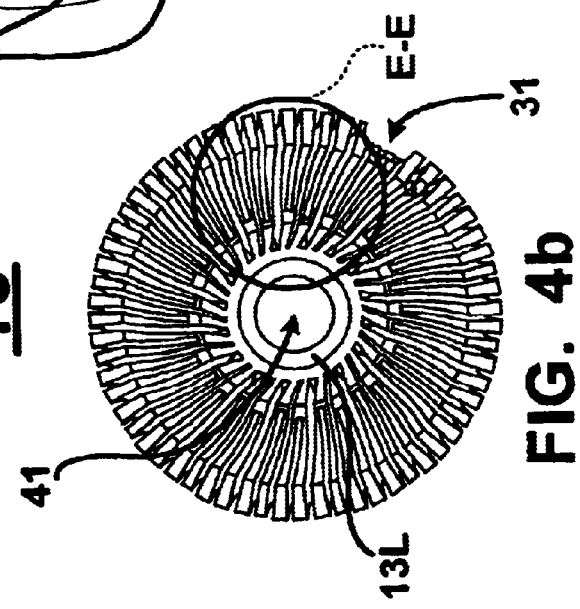
FIG. 4c
FIG. 4b

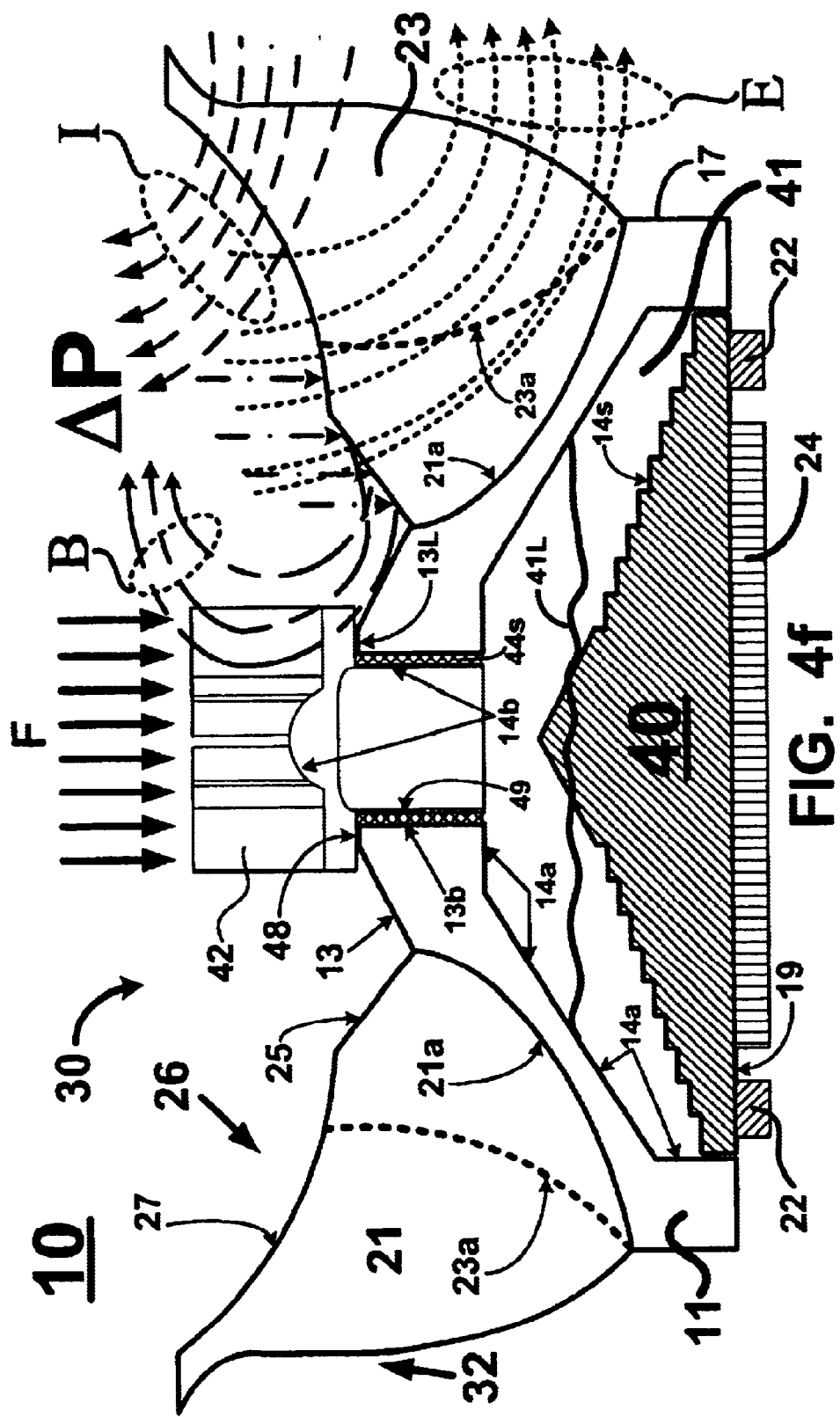

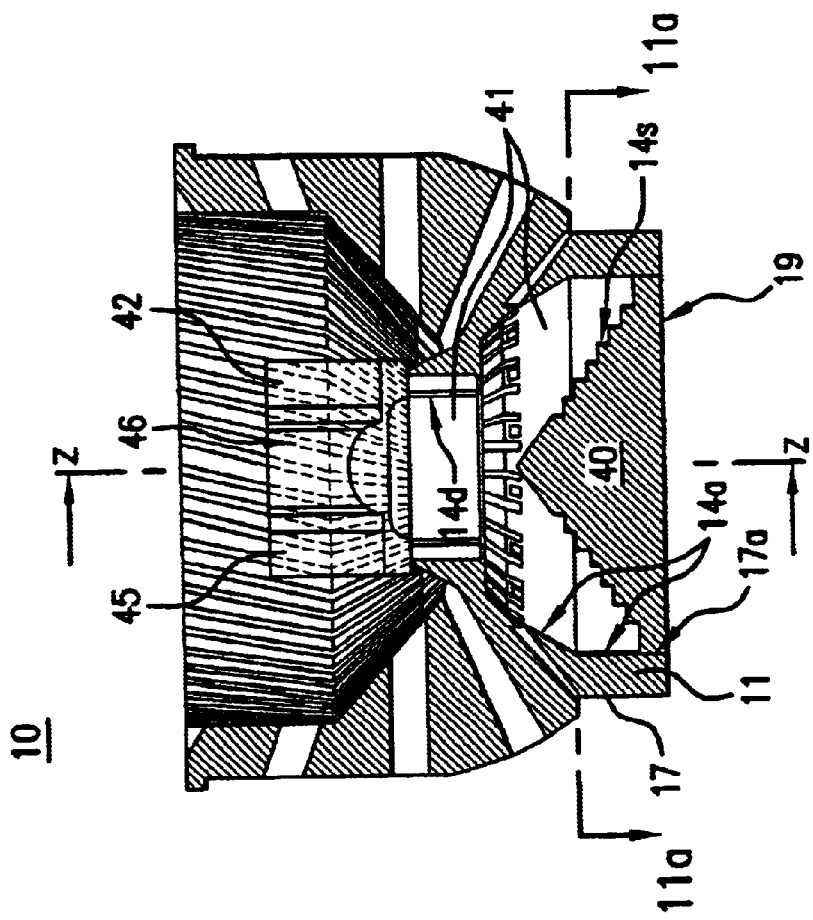
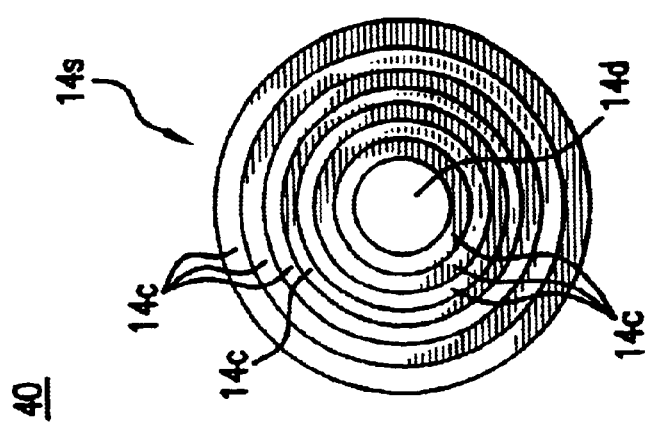
FIG. 5a
FIG. 5b

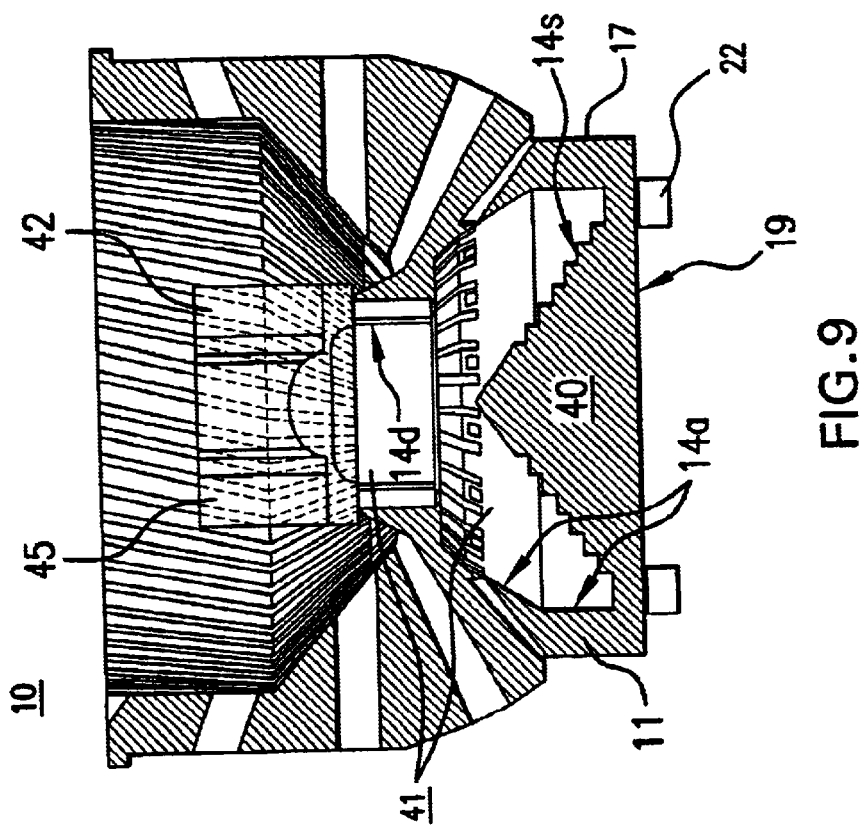
FIG.9
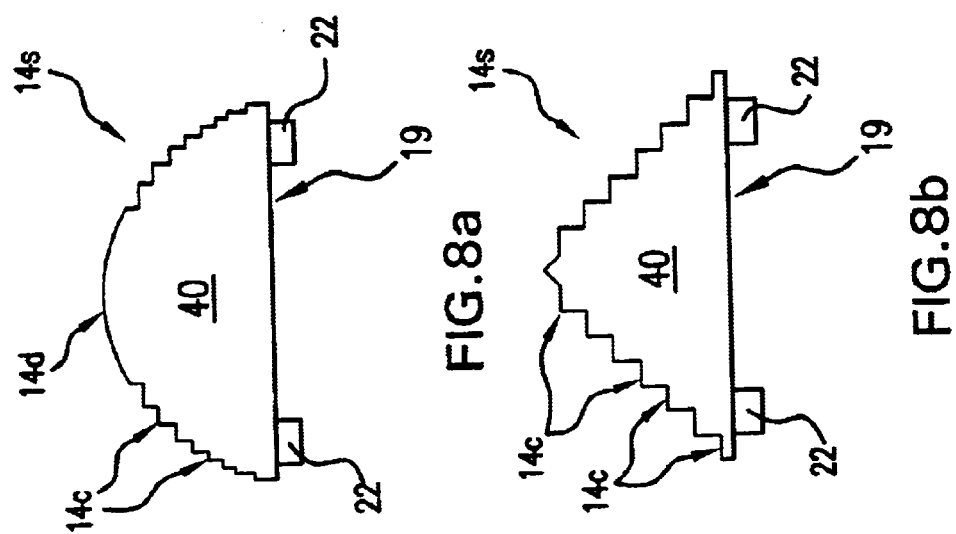
FIG.8a
FIG.8b

HIGH PERFORMANCE COOLING DEVICE WITH VAPOR CHAMBER

FIELD OF THE INVENTION

The present invention relates generally to a cooling device including a vapor chamber for removing heat from a component connected with the cooling device. More specifically, the present invention relates to a cooling device including a heat mass with a plurality of fins and vanes and a vapor chamber that contains a phase change liquid at a low pressure that transforms to a vapor when heated to its boiling point by waste heat from the component so that the heat mass is cooled by the boiling of the phase change liquid and is convection cooled by an air flow through the vanes and fins.

BACKGROUND OF THE INVENTION

It is well known in the electronics art to place a heat sink in contact with an electronic device so that waste heat generated by operation of the electronic device is thermally transferred to the heat sink thereby cooling the electronic device. With the advent of high clock speed electronic devices such as microprocessors ($\mu$P), digital signal processors (DSP), and application specific integrated circuits (ASIC), the amount of waste heat generated by those electronic devices and the operating temperature of those electronic devices are directly proportional to clock speed. Therefore, higher clock speeds result in increased waste heat generation which in turn increases the operating temperature of the electronic device. However, efficient operation of the electronic device requires that waste heat be continuously and effectively removed.

Heat sink devices have become commonplace as a means for dissipating waste heat from electronic devices such as the types described above. In a typical application, a component to be cooled is carried by a connector that is mounted on a PC board. A heat sink is mounted on the component by attaching the heat sink to the connector using a clip or fasteners, for example. Alternatively, the heat sink is mounted to a PC board that carries the electronic device and fasteners or the like are used to connect the heat sink to the PC board via holes that are drilled in the PC board.

The need to drill holes can be one disadvantage to using fasteners because the fasteners or other mounting hardware used for connecting the heat sink to the PC board are usually electrically conductive and there is a risk of an electrical short due to contact between a PC board trace and the mounting hardware. Moreover, to avoid electrical shorts, the PC board traces can be routed around the hole, but that routing requires keep out zones that can complicate the routing of the traces.

Typically, a heat sink used in conjunction with a modern high clock speed electronic device will use an electrical fan mounted on top of the heat sink or within a cavity formed by cooling fins/vanes of the heat sink. The cooling fins increase the surface area of the heat sink and maximize heat transfer from the heat sink to ambient air that surrounds the heat sink. The fan causes air to circulate over and around the cooling fins thereby transferring heat from the cooling fins into the ambient air.

As mentioned previously, with continuing increases in clock speed, the amount of waste heat generated by electronic devices has also increased. Accordingly, to adequately cool those electronic devices, larger heat sinks and/or larger capacity fans (i.e. in CFM) are required. Increasing the size of the heat sink results in a greater thermal mass and a greater surface area from which the heat can be dissipated. Increases in fan capacity increase the air flow through the cooling fins.

There are disadvantages to increased fan and heat sink size. First, if the size of the heat sink is increased in a vertical direction (i.e. in a direction transverse to the PC board), then the heat sink is tall and may not fit within a vertical space in many applications, such as the chassis of a desktop computer. Second, if the PC board has a vertical orientation, then a heavy and tall heat sink can mechanically stress the PC board and/or the electronic device resulting in a device or PC board failure.

Third, a tall heat sink will require additional vertical clearance between the heat sink and a chassis the heat sink is contained in to allow for adequate air flow into or out of the fan. Fourth, if the heat sinks size is increased in a horizontal direction, then the amount of area available on the PC board for mounting other electronic devices is limited. Fifth, when the heat sink has a cylindrical shape formed by the fins it is often not possible to mount several such heat sinks in close proximity to each other because air flow into and out of the fins is blocked by adjacent heat sinks with a resulting decrease in cooling efficiency.

Finally, increases in fan size to increase cooling capacity often result in increased noise generation by the fan. In many applications such as the desktop computer or a portable computer, it is highly desirable to minimize noise generation. In portable applications that depend on a battery to supply power, the increased power drain of a larger capacity fan is not an acceptable solution for removing waste heat.

In the above mentioned heat sink with cooling fins there are additional disadvantages to mounting the fan within a cavity formed by the fins. First, a substantial portion of a heat mass of the heat sink is partially blocked by the fan because the fan is mounted directly on the heat mass and therefore blocks a potential path for heat dissipation from the heat mass because air from the fan does not circulate over the blocked portion of the heat mass.

Second, without the fan, a depth of the fins could extend all the way to a center of the heat mass; however, the depth and surface area of the fins is reduced by a diameter of the fan because the fan is mounted in a cavity having a diameter that is slightly larger than the fans diameter to provide clearance for the fan blades. Consequently, the heat mass of the heat sink must be made broader to compensate for the reduced surface area of the fins. The broader heat mass increases the size, cost, and weight of the heat sink.

Third, the reduced depth of the fins makes it easier for the fins to be bent if damaged. One possible consequence of a bent fin is that it will contact and damage the fan blades and/or cause the fan to stall thereby damaging the fan or causing the fan to fail. Fourth, because the fan is mounted in the cavity formed by the fins, power leads for the fan must be routed through a space between the fins. Sharp edges on the fins can cut the power leads or cause an electrical short. In either case, the result is that the fan will fail. Fifth, glue is typically used to mount the fan to the heat sink and the glue can get into the fan and cause the fan to fail. Any of the above mentioned fan failure modes can lead to a failure of the electronic device the heat sink was designed to cool because air circulation generated by the fan is essential to effectively dissipate waste heat from the electronic device.

Some prior heat sinks attempt to overcome the aforementioned disadvantages of a larger heat mass or increased fin area by using vapor chamber that is filled with a phase change liquid at a low pressure. Typically, the phase change liquid has a low boiling point so that it will boil and convert to a vapor phase in response to waste heat from a component that is thermally connected with the heat mass. The vapor chamber is press fitted into a body of the heat sink. In some instances, an outer casing of the vapor chamber is expanded to achieve a tighter contact between the vapor chamber and the heat sink. Typically, a metal joining process such as brazing or soldering is used to seal the vapor chamber.

One disadvantage of the prior heat sinks with a vapor chamber is that their performance (i.e. efficiency at dissipating waste heat) deteriorates considerably when the vapor chamber is made to tilt from a vertical axis thereby decreasing heat transfer to the phase change liquid.

Another disadvantage is that there are micro voids and/or larger gaps between the vapor chamber and the heat sink that result in an increase in a thermal resistance between the heat sink and the vapor chamber. Consequently, heat transfer from the vapor chamber to the heat sink is reduced.

Consequently, there is a need for a cooling device with a vapor chamber that allows the cooling device to be tilted from a vertical axis while still maintaining heat transfer to a phase change liquid. There is also a need for a cooling device with a vapor chamber that eliminates micro gaps between the vapor chamber and the cooling device so that there is a low thermal resistance between the vapor chamber and the cooling device.

SUMMARY OF THE INVENTION

In view of the foregoing, a brief summary of some of the exemplary embodiments of the present invention are presented in this summary. Some simplifications and omissions may be made in this summary, which is intended to highlight and introduce some aspects of the present invention, but not to limit the scope of the present invention in any way. Detailed descriptions of the preferred embodiments adequate to allow one of ordinary skill in the art to understand, make, and use the present invention are provided following this summary.

Broadly, the present invention is embodied in a cooling device for dissipating waste heat from a component to be cooled. The cooling device includes a heat mass with a base, a chamber bore extending inward of the base and a boss symmetrically positioned about an axis of the heat mass. The boss includes a land and a threaded bore extending through the boss to the chamber bore. A thermal core is connected with the base and includes a stepped face that extends into the chamber bore and a mounting surface adapted to thermally connect the thermal core and the heat mass with the component to be cooled. A plug including a step face and a threaded neck that extends from the step face. The threaded neck is threaded into the threaded bore of the boss. The plug also includes a plug cavity formed in the threaded neck and a plurality of plug fins that are spaced apart to define a plug slot between adjacent plug fins. A vapor chamber is defined by the plug cavity, the chamber bore, and the stepped face. A phase change liquid is sealed in the vapor chamber at a low pressure and the phase change liquid is in contact with a portion of the stepped face.

A plurality of vanes are connected with the heat mass and are spaced apart to define a primary slot between adjacent vanes that extend to the heat mass. The vanes have a surface area that increases in a radially outward direction from the axis of the heat mass and the vanes include at least one secondary slot extending through a portion of each vane to define a plurality of fins in each vane. The vanes include a top face, an aerodynamically profiled inner wall that includes a first portion extending from the boss and terminating at a second portion that extends to the top face of the vanes. The inner walls of the vanes define a chamber that surrounds the boss The vanes also include an outer wall that has a surface profile that widens from the base of the heat mass to the top face and includes therebetween a smooth curved portion, a draft portion, and a smooth radially outward portion.

Waste heat in the component is thermally conducted into the thermal core and the heat mass and is dissipated from the heat mass by an air flow through the chamber, the primary slots, the secondary slots, and the plug slots. Waste heat is also thermally conducted into the thermal core and is dissipated by causing the phase change liquid to boil and change from a liquid state to a vapor state. The vapor rises into the vapor chamber and contacts the plug cavity and the chamber bore where it cools upon contact and converts back to the liquid state.

One advantage of the cooling device of the present invention is that the stepped face of the thermal core allows the cooling device to be tilted from a vertical axis while still maintaining heat transfer to the phase change liquid so that the phase change liquid boils and is converted to the vapor phase thereby dissipation waste heat from the thermal core.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 4a and 4b are top plan views of fins and vanes of a cooling device according to the present invention.

FIG. 4c is a detailed view of a section E—E of FIG. 4b.

FIG. 4f is a cross-sectional view along line A—A of FIG. 4e of an air flow through a cooling device according to the present invention.

FIG. 5a is a cross-sectional view along line A—A of FIG. 4e of a cooling device according to the present invention.

FIG. 5b is a top plan view of a stepped face of a thermal core according to the present invention.

FIGS. 8a and 8b are a cross-sectional views of a stepped face with an arcuate profile and a sloped profile respectively according to the present invention.

FIG. 9 is a cross-sectional view of a vapor chamber and a thermal core with projections on a mounting surface thereof according to the present invention.

DETAILED DESCRIPTION

Figure 1:
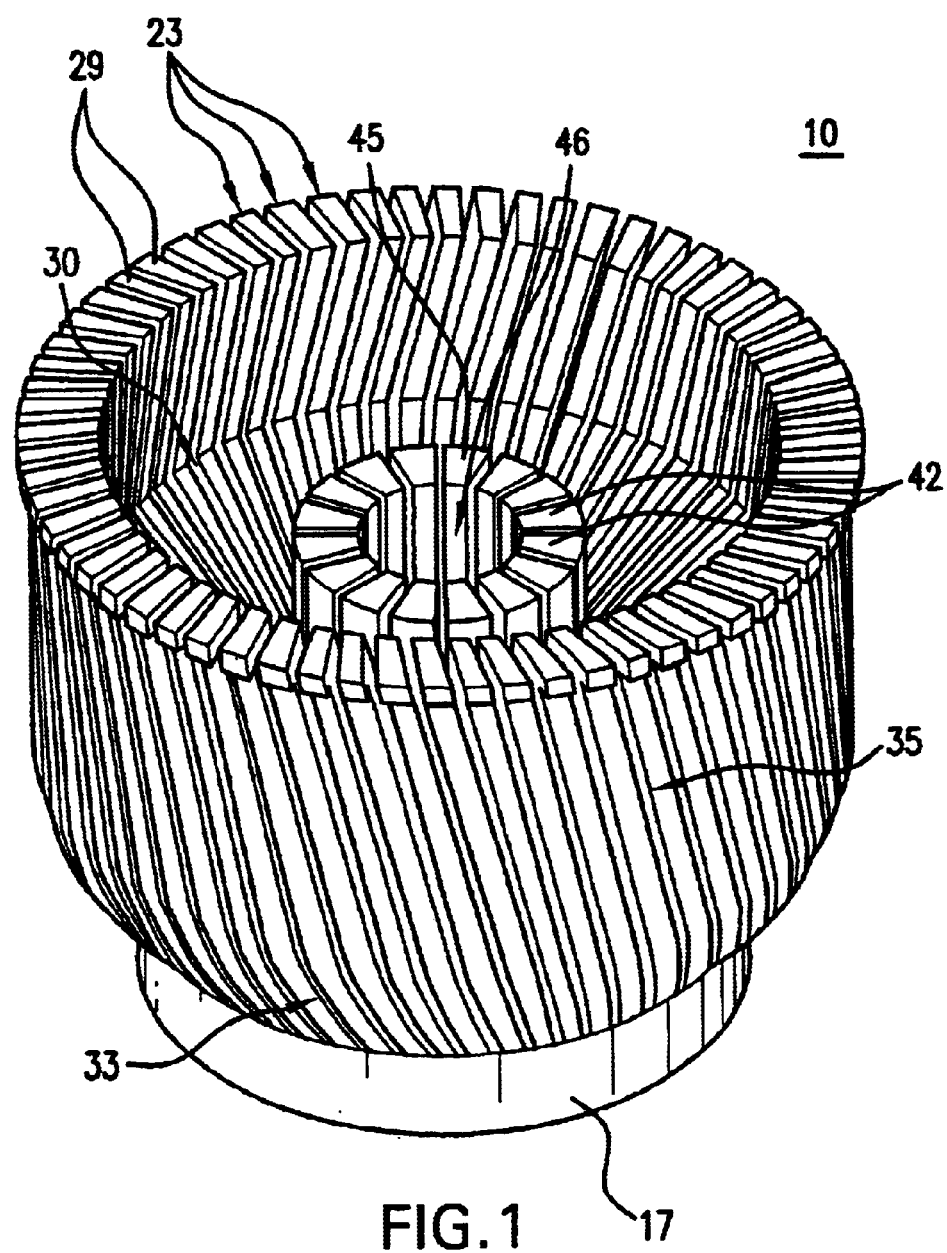
FIG. 1 is a profile view of a cooling device according to the present invention.
Figure 2:
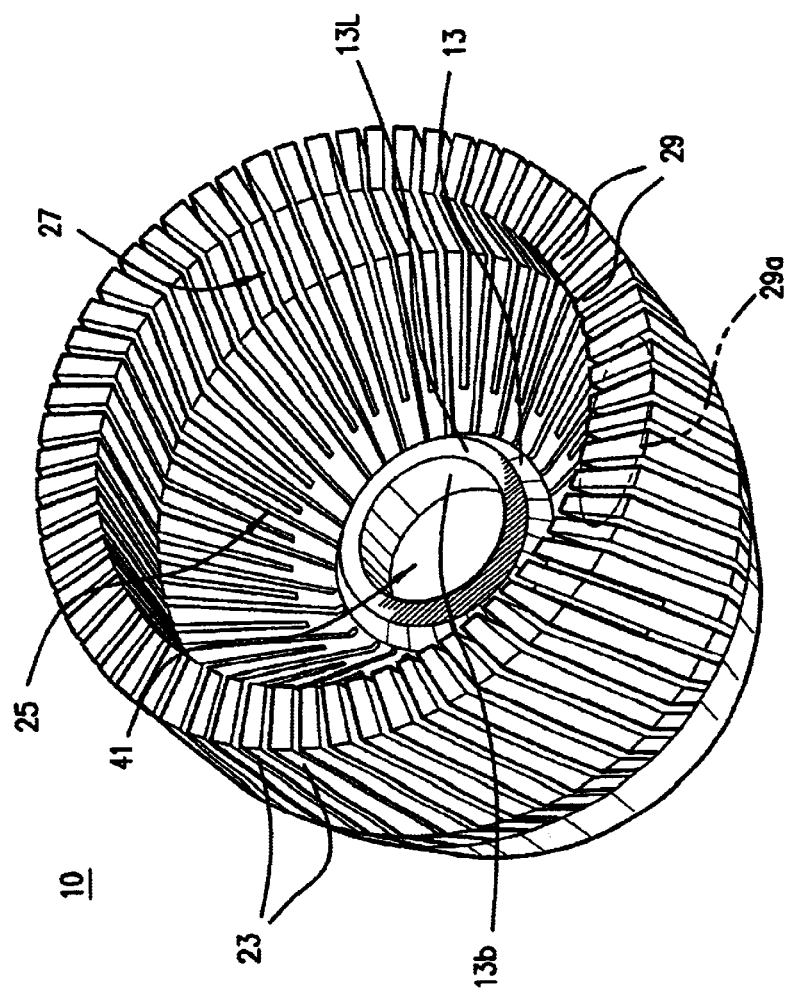
FIG. 2 is a top profile view of a cooling device and depicts a threaded bore that extends to a chamber bore according to the present invention.

In the following detailed description and in the several figures of the drawings, like elements are identified with like reference numerals.

As shown in the drawings for purpose of illustration, the present invention is embodied in a cooling device for dissipating heat from a component that is in thermal communication with a thermal core and a heat mass of the cooling device. The thermal communication can be by direct contact between the thermal core and the component or by an intermediate material (e.g a thermal interface material) positioned between the thermal core and the component as will be described below. A portion of the base of the heat mass may also be in direct or indirect thermal contact with the component. The component can be any heat source including but not limited to an electrical component, for example.

The cooling device includes a heat mass including a base and a chamber bore that extends inward of the base. A boss is symmetrically positioned about an axis of the heat mass and includes a land and a threaded bore that extends from the boss to the chamber bore such that the threaded bore defines a through hole from the boss to the chamber bore. A thermal core is connected with the base and includes a stepped face that extends into the chamber bore and a mounting surface adapted to thermally connect the thermal core and the heat mass with the component. A plug including a threaded neck adapted to be threaded in the threaded bore of the heat mass until a step face of the plug is in contact with the land on the boss. The plug includes a plug cavity formed in the threaded neck and plurality of plug fins. The plug fins are spaced apart to define a plug slot between adjacent plug fins. The plug cavity, the chamber bore, and the stepped face define a vapor chamber. A phase change liquid is sealed in the vapor chamber at a low pressure and the phase change liquid is in contact with a portion of the stepped face.

The heat mass further includes a plurality of vanes connected with the heat mass and spaced apart to define a primary slot adjacent vanes. The primary slot extends to the heat mass. The vanes have a surface area that increases in a radially outward direction from the axis of the heat mass. At least one secondary slot extending through a portion of each vane defines a plurality of fins in each vane. The secondary slots may also extend to the heat mass. Each vane further includes a top face an aerodynamically profiled inner wall that includes a first portion extending from the boss and terminating at a second portion that extends to the top face. The inner walls of the vanes define a chamber that surrounds the boss. An outer wall of the vanes includes a surface profile that widens from the base to the top face and includes between the base and the top face: a smooth curved portion; a draft portion; and a smooth radially outward portion.

Waste heat from the component is dissipated from the heat mass by an air flow through the chamber, the primary slots of the vanes, the secondary slots of the fins, and the plug slots in the plug fins. Additionally, waste heat in the thermal core is dissipated by converting the phase change liquid that is in contact with the stepped face from a liquid state to a vapor state (i.e. the waste heat causes the phase change liquid to boil).

The air flow entering the chamber creates a three-dimensional air flow that dissipates heat from the cooling device. First, the air flow exits the primary slots and a bottom portion of the secondary slots in an exhaust flow that dissipates heat from the vanes, the fins, and the plug fins. Second, the exhaust flow creates a low pressure region within the chamber that induces an intake flow into the chamber through a major portion of the secondary slots and a top portion of the primary slots thereby dissipating heat from the fins and the vanes. Third, the low pressure region induces a surface flow along the first and second portions of the inner wall so that the surface flow wets over the boss as it passes over the boss to dissipate heat from the heat mass. The air flow can be a positive air flow that enters the chamber or a negative air flow that exits the chamber.

In FIGS. 1 through 5a, a cooling device 10 for dissipating heat from a component (not shown) includes a heat mass 11, a base 17, a chamber bore 14a extending inward of the base 17, a boss 13, and a land 13L. The boss 13 is symmetrically positioned about an axis Z of the heat mass 11. A threaded bore 13b extends through the boss 13 to the chamber bore 14a so that the threaded bore 13b defines a through hole between the boss 13 and the chamber bore 14a. A thermal core 40 is connected with the base 17 and includes a stepped face 14s that extends into the chamber bore 14a and a mounting surface 19 that is adapted to thermally connect the thermal core 40 and the heat mass 11 with the component to be cooled. The stepped face 14s can include a plurality of steps 14c along a portion of its surface and that terminate at an apex 14d as depicted in FIGS. 5b, 8a, and 9 or the stepped face 14s can include a plurality of the steps 14c substantially along an entirety of its surface as depicted in FIG. 8b.

Figure 3A:
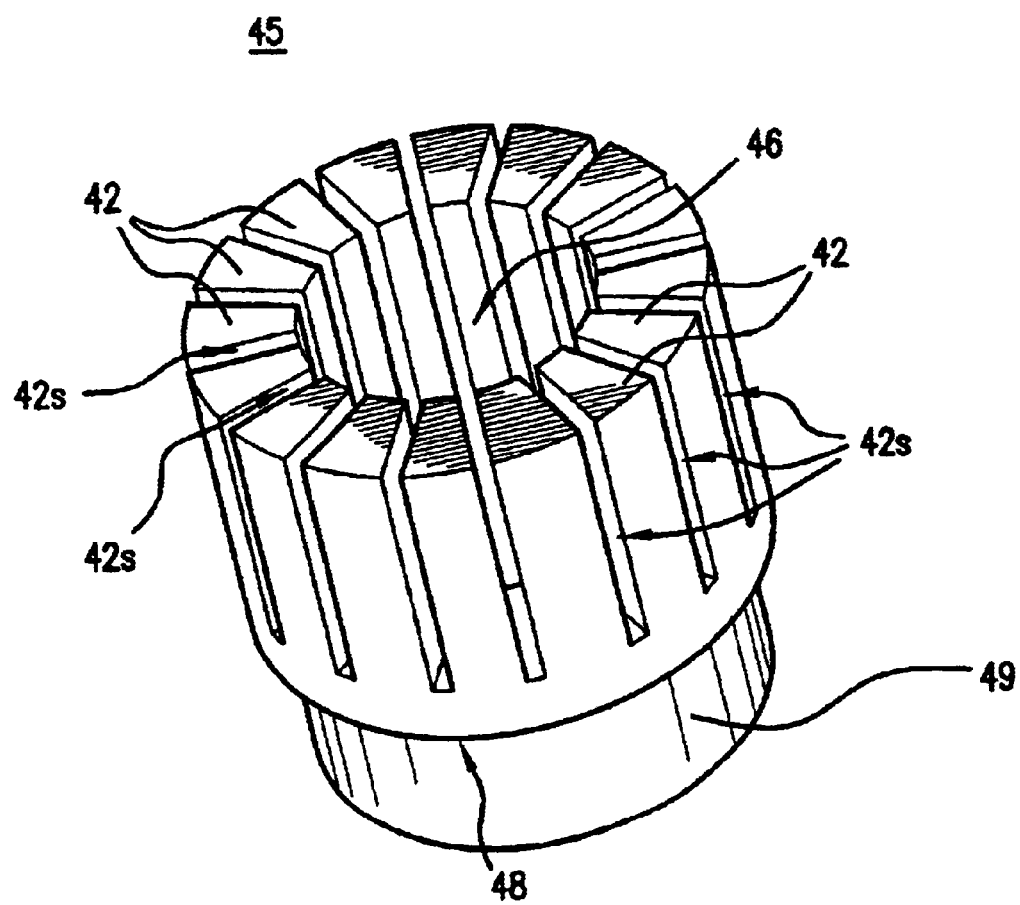
FIGS. 3a and 3b are top and bottom profile views respectively of a plug according to the present invention.
Figure 3C:
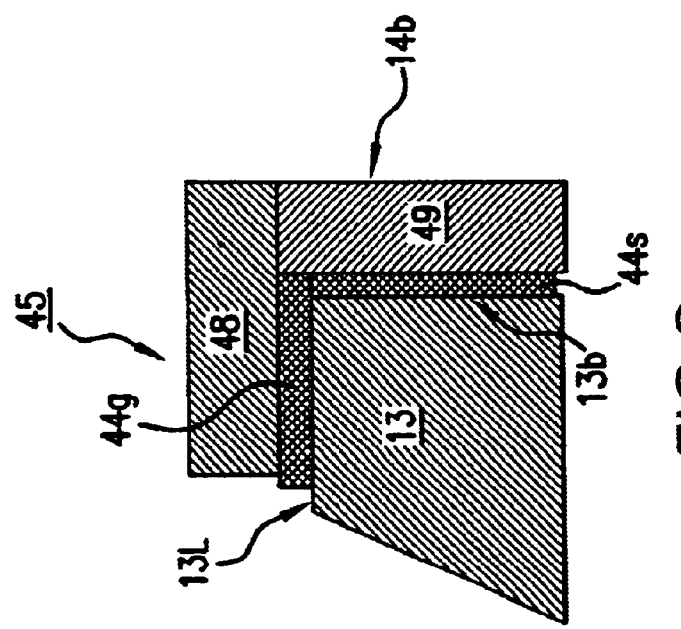
FIG. 3c is a cross-sectional view of a boss and a plug with a gasket and a sealant material according to the present invention.
Figure 3B:
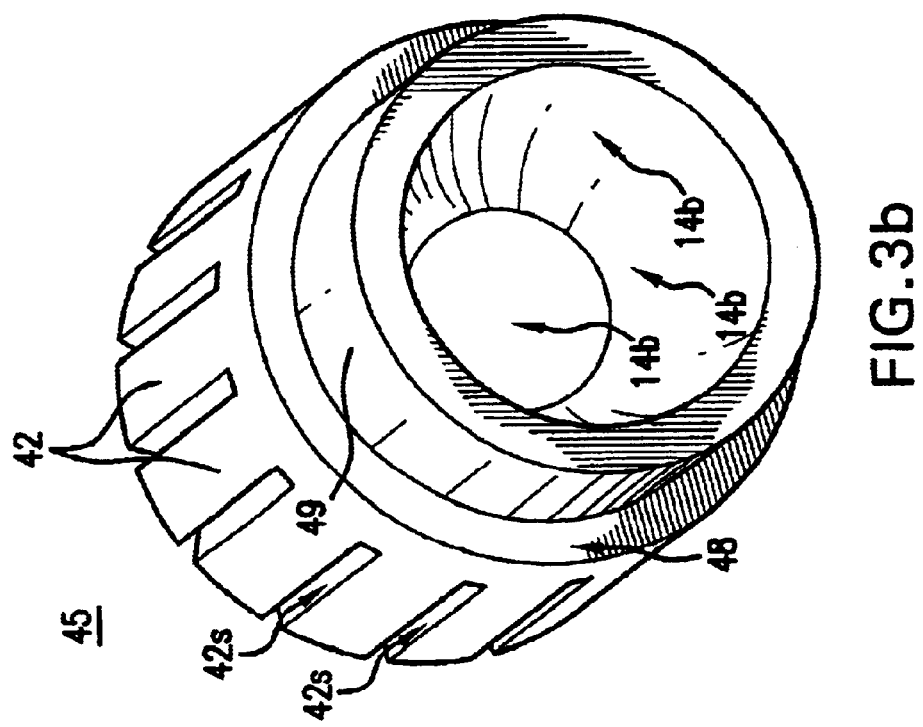

In FIGS. 3a and 3b, the cooling device 10 further includes a plug 45 including a plurality of plug fins 42 that are spaced apart from each other to define a plug slot 42s between adjacent plug fins 42, a step face 48, a threaded neck 49 extending from the step face 48 and adapted to be threaded into the threaded bore 13b until the step face 48 is in contact with the land 13L of the boss 13. The plug 45 also includes a plug cavity 14b formed in the threaded neck 49. In FIGS. 5a and 9, the plug cavity 14b, the chamber bore 14a, and the stepped face 14s define a vapor chamber 41. In FIGS. 10b, 10c, and 10d, a phase change liquid 41L is sealed in the vapor chamber 41 at a low pressure and is in contact with a portion of the stepped face 14s. As an example, the vapor chamber 41 can be sealed by connecting the thermal core 40 with the base 17 followed by filling the vapor chamber 41 with the phase change liquid 41L by pouring the phase change liquid 41L through the threaded bore 13b and then sealing the vapor chamber 41 by threading the threaded neck 49 of the plug 45 into the threaded bore 13b. As another example, the vapor chamber 41 can be sealed by first threading the plug 45 into the threaded bore 13b followed by filling the vapor chamber 41 with the phase change liquid 41L by pouring the phase change liquid 41L through the base 17, and then sealing the thermal core 40 to the base 17 to seal the vapor chamber 41. The sealing process can occur under a vacuum so that the phase change liquid 41L is sealed in the vapor chamber at a low pressure (i.e. a pressure less than atmospheric pressure).

The vacuum needed will be application dependent and will also depend on the material selected for the phase change liquid 41L and a capacity of a vacuum pump used. As an example, the magnitude of the waste heat to be dissipated and the temperature at which the phase change liquid will convert from the liquid state (41L) to the vapor state (41V) will determine the amount of vacuum needed. Generally, the lower the temperature required to achieve the phase change from the liquid 41L to the vapor 41V, the better the performance of the cooling device 10. A standard steam table can be used to determine the magnitude of vacuum needed for a required phase change. For instance, using water ($H_2O$) for the phase change liquid 41L, a vacuum of about 9.59 Kpa pressure inside the vapor chamber 41 resulted in a phase change from the liquid 41L to the vapor 41V at about 45.0° C.

In FIG. 3c, in one embodiment of the present invention, to ensure the vapor chamber 41 is sealed to prevent any leakage of the phase change liquid 41L, a sealant material 44s can be applied to the threaded bore 13b and/or the threaded neck 49. Note, that in FIG. 3c, only a portion of the boss 13 and the plug 45 are depicted in order to illustrate the position of the sealant material 44s and a gasket 44g relative to those elements of the cooling device 10. The sealant material 44s improves a seal between the threads of the bore and the neck (13b, 49) thereby sealing a potential leak path between the threads.

For example, the sealant material 44s can be made from ANABOND® or LOCTITE®. The sealant material 44s can be applied to the threads of the bore and the neck (13b, 49) using a dispenser, a brush, or dipping the threaded neck 49 into the sealant material 44s. After the sealant material 44s is applied, the threaded neck is threaded into the threaded bore 13b. The sealant material 44s may also be applied to the step face 48.

In another embodiment of the present invention, the sealant material 44s thermally isolates the plug 45 from the heat mass 11. Because of the thermal isolation of the plug 45, the air flow F through the plug fins 42 (see FIG. 10a) results in the plug 45 being at a lower temperature than the heat mass 11. Consequently, the vapor 41V that comes into contact with the plug cavity 14b is more effectively cooled and condenses 41C at a higher rate back to the liquid state 41L than if the plug 45 were not thermally isolated from the heat mass 11. The material used for thesealant material 44s can be selected to provide the desired thermal isolation properties.

Suitable sealant material 44s for thermally isolating the plug 45 from the heat mass 11 include but are not limited to RTV sealants, HiTac® tape and sealants, and Epoxy based FRP type sealants. Essentially, any thermally non-conductive sealant material that is operative to thermally isolate the plug 45 from the heat mass 11 can be used.

In yet another embodiment of the present invention, to ensure the vapor chamber 41 is sealed to prevent any leakage of the phase change liquid 41L, a gasket 44g is positioned between the land 13L and the step face 48. The gasket 44g seals a potential leak path between the land 13L and the step face 48. The gasket 44g is positioned on the land 13L or on the step face 48 prior to threading the plug 45 into the threaded bore 13b. The gasket can be an appropriately sized metal washer or a gasket material cut to an appropriate shape, for example.

Suitable materials for the gasket 44g include but are not limited to HiTac® gaskets, RFI gaskets, and rubber gaskets. Preferably, the rubber gasket is made from a thermally non-conductive material. After placing the gasket over the threaded neck 49, the plug can be tightened to a torque of about 21.0 in-lbs, for example.

Figure 13:
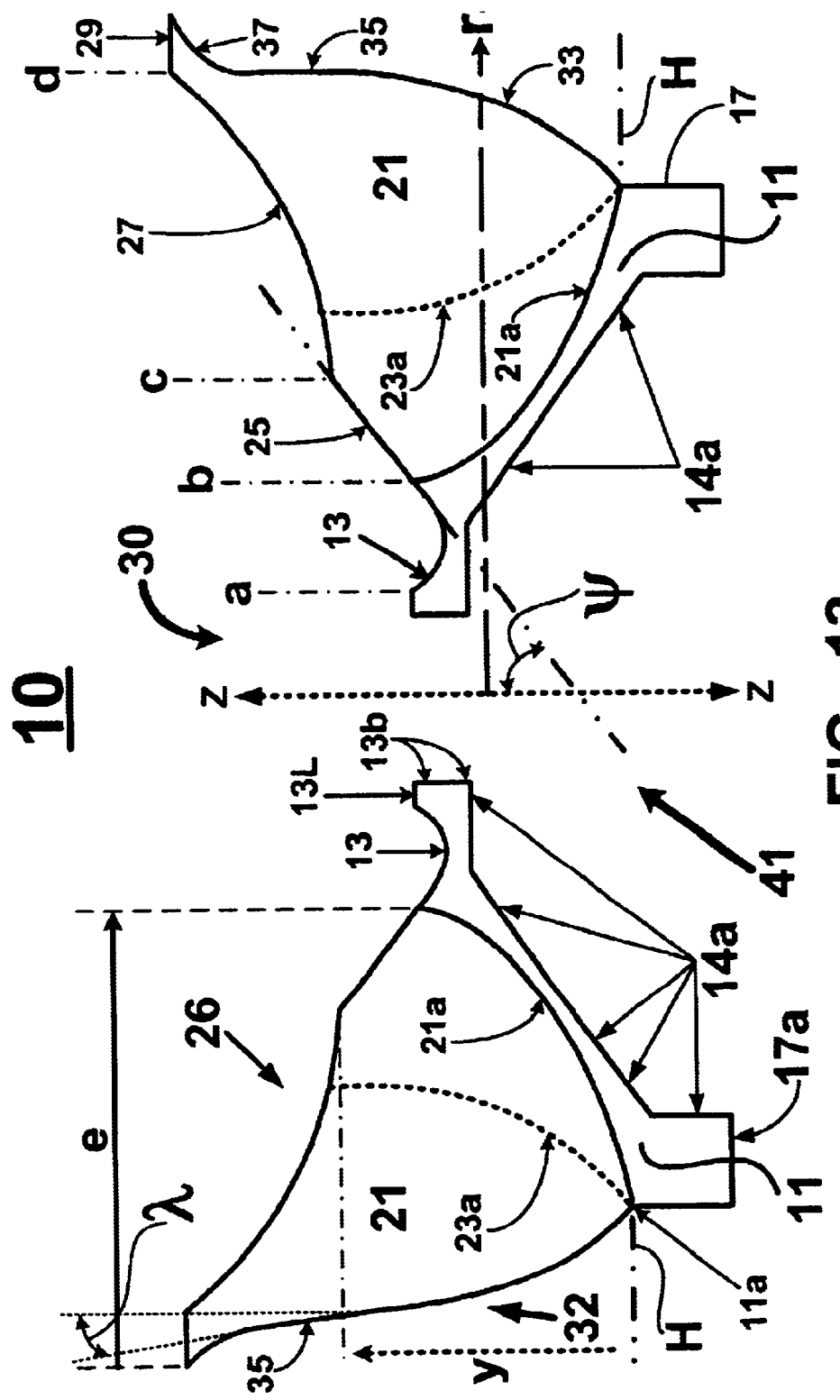
FIG. 13 is a cross-sectional view along line A—A of FIG. 4a of a cooling device with a heat mass and a chamber bore according to the present invention.

In FIG. 13, a plurality of vanes 21 are in contact with the heat mass 11 and the vanes 21 are spaced apart from one another to define a primary slot P (see FIGS. 4a, 4c and 4d) between adjacent vanes 21. The vanes 21 have a surface area that increases in a radially outward direction from the axis Z as indicated by the dashed arrow r. At least a portion of the vanes 21 have a surface area that increases in a direction along the axis Z as shown by dashed arrow y.

Preferably, the primary slot P extends to the heat mass 11 and the primary slot P includes a first arcuate surface profile 21a along the heat mass 11. The first arcuate profile 21a terminates on a plane H—H (see FIG. 13). It is also preferable that the vanes 21 are equidistantly spaced apart from each another. By extending the primary slot P to the heat mass 11, an air flow through the primary slots P also wets over (i.e. flows over) the heat mass 11 (i.e the air flows over the heat mass 11) to dissipate heat therefrom. The first arcuate surface profile 21a can be an arc having a radius from about 38.0 mm to about 45.0 mm.

One advantage of the cooling device 10, is that a fan (not shown) for generating the air flow is not mounted on the heat mass 11. Consequently, the vanes 21 can extend deep into the heat mass 11 (as illustrated by an arrow e) and the depth of the vanes 21 provides a large surface area for efficient dissipation of waste heat and exposes the heat mass 11 to an air flow (see FIGS. 4e and 4f) that wets over the boss 13 so that additional waste heat can be dissipated from the heat mass 11.

The vanes 21 also include a top face 29, an aerodynamically profiled inner wall 26 including a first portion 25 that extends from the boss 13 and terminates at a second portion 27 that extends to the top face 29. The first portion 25 blends with an arcuate profile (see FIG. 13) or sloped profile (see FIG. 4f) of the boss 13 as illustrated by dashed line b and the first portion 25 blends with the second portion 27 as illustrated by dashed line c. The second portion 27 blends with the top face 29 as illustrated by dashed line d. The inner wall 26 can include additional portions and the present invention is not to be construed as being limited to the first and second portions (25, 27). The inner wall 26 defines a chamber 30 that surrounds the boss 13.

In one embodiment of the present invention, as illustrated in FIGS. 13, and 4c, the first portion 25 of the inner wall 26 is a slope surface and the second portion 27 of the inner wall 26 is a concave arcuate surface. The sloped and concave arcuate surfaces aerodynamically interact with an air flow into the chamber 30 so that the air flows along the first and second portions (25, 27) of the inner wall 26 and wets over the boss 13 to dissipate heat from the heat mass 11 as will be described below in reference to FIGS. 4e and 4f.

The first portion 25 can be inclined at an angle ψ with respect to the axis Z as illustrated in FIG. 13. The angle ψ can be in a range from about 15.0 degrees to about 75.0 degrees. If the vanes 21 have a tangential orientation with a circle about the axis Z as will be discussed below in reference to FIG. 4d, then the first portion 25 will have a tangential orientation with the boss 13. The angle ψ will vary based primarily on an output of a fan (not shown) in cubic feet per minute (CFM).

In FIG. 13, the vanes 21 further include an outer wall 32 having a surface profile that widens from a bottom 11a of the heat mass 11 to the top face 29 and includes a smooth curved portion 33, a draft portion 35, and a smooth radially outward portion 37. The draft portion 35 an be substantially parallel to the axis Z or the draft portion 35 can be inclined at an angle λ.

Figure 4A:
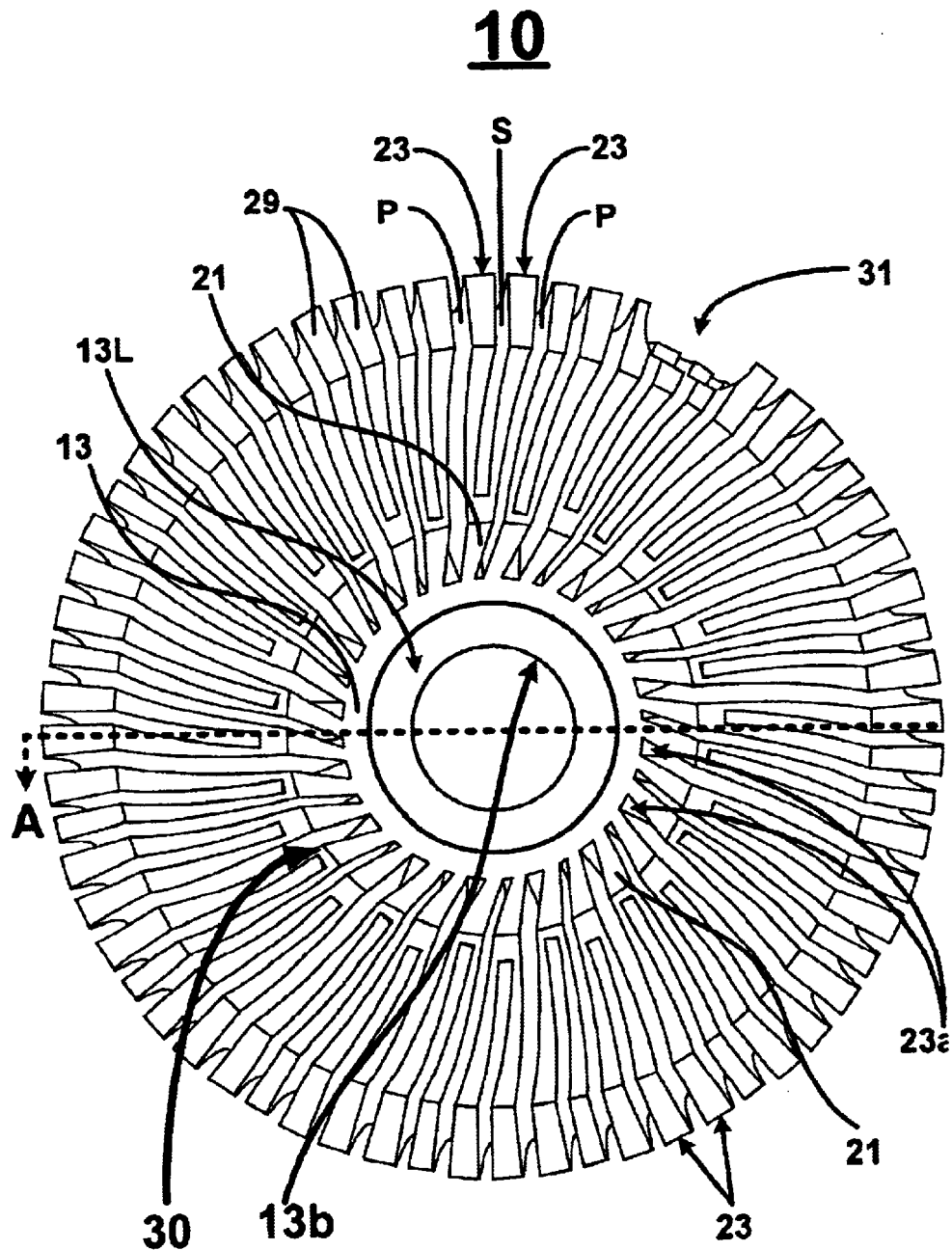

In FIGS. 4a through 4c, the vanes 21 include at least one secondary slot S that extends through a portion of each vane 21 to define a plurality of fins 23 (two are shown) in each vane 21. By splitting at least a portion of each vane 21 into a plurality of fins 23, the available surface area for dissipating waste heat is increased and the secondary slot S provides an additional air flow path between the fins 23 that further increases waste heat dissipation.

In another embodiment of the present invention, the secondary slot S extends to the heat mass 11 and the secondary slot S includes a second arcuate profile 23a (see dashed line in FIG. 13) along the heat mass 11. The second arcuate profile 23a terminates on the plane H—H. By extending the secondary slot S to the heat mass 11, the air flow through the fins 23 also wets over the heat mass 11 to dissipate heat therefrom. The second arcuate profile 23a can be an arc having a radius from about 31.0 mm to about 38.0 mm.

Reference points for a center of the above mentioned radiuses (i.e. for 21a and 23a) will be positioned outside the cooling device 10 and the actual location of the center will depend on the arcs radius. However, the position of the center of the radius will be at least about 5.0 mm outside of the cooling device 10 to accommodate a cutting tool used in a machining process for making the cooling device 10. The position of the center of the radius is a limitation imposed by a machining process that uses cutting wheels to form the vanes 21 and the fins 23. If the vanes 21 and the fins 23 can be diecasted or impact forged, then the arc radius could be reduced and the position of the center of the radius could come inside the cooling device 10. The cooling device 10 can be made amendable to a diecasted or impact forged process by reducing the number of vanes 21.

Figure 10A:
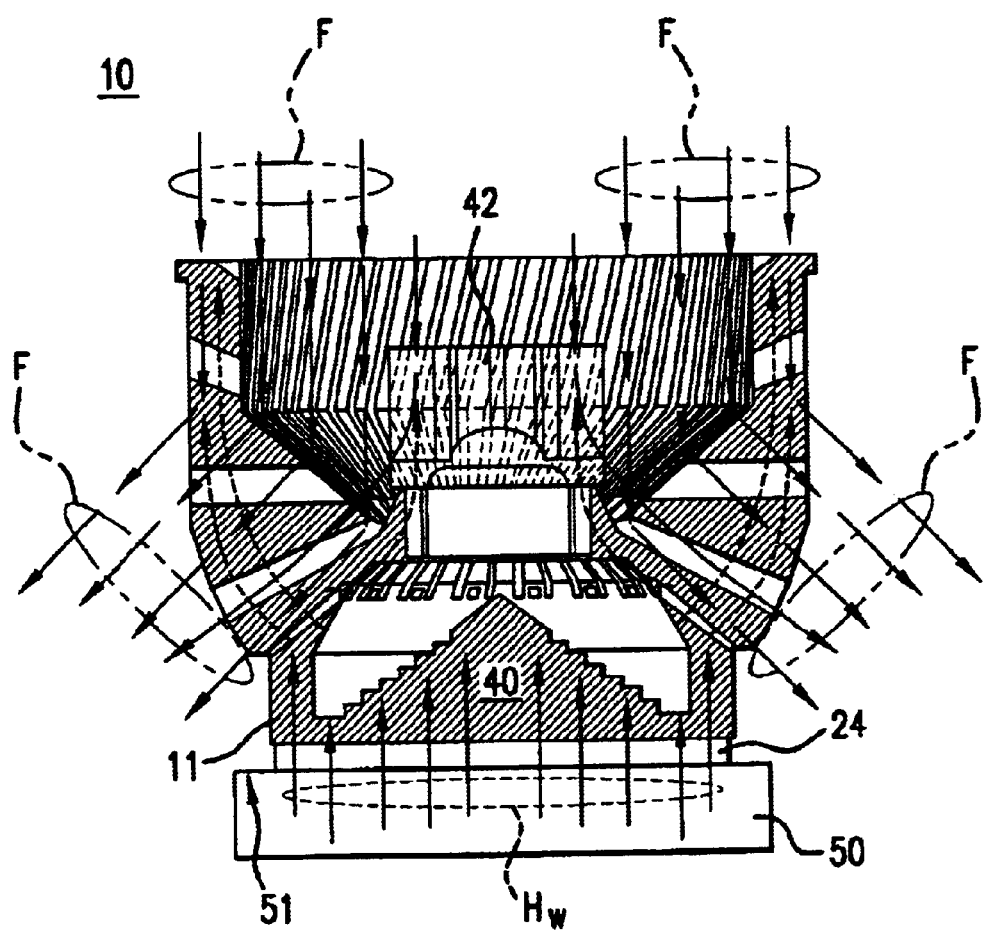
FIG. 10a is a cross-sectional view depicting convection cooling according to the present invention.
Figure 10B:
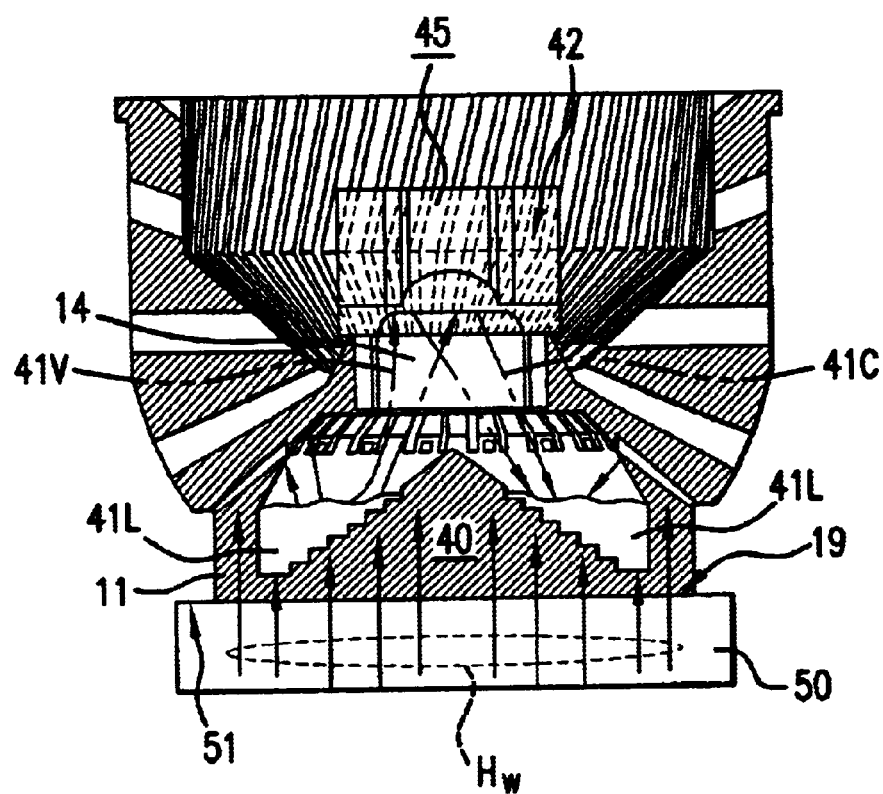
FIG. 10b is a cross-sectional view depicting evaporative cooling according to the present invention.
Figure 10D:
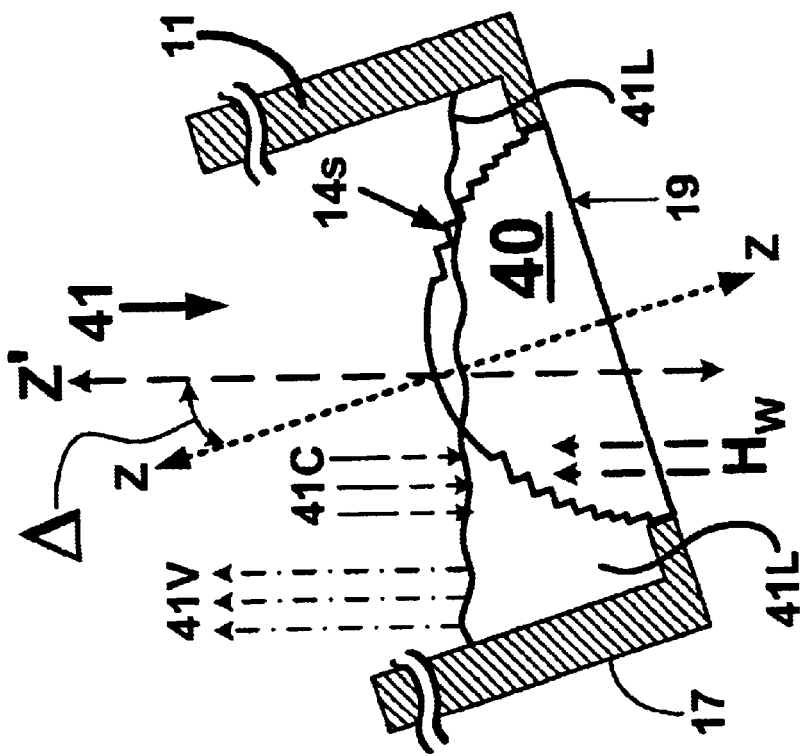
FIGS. 10c and 10d are cross-sectional views depicting an un-tilted and a tilted vapor chamber of a cooling device respectively, according to the present invention.
Figure 10C:
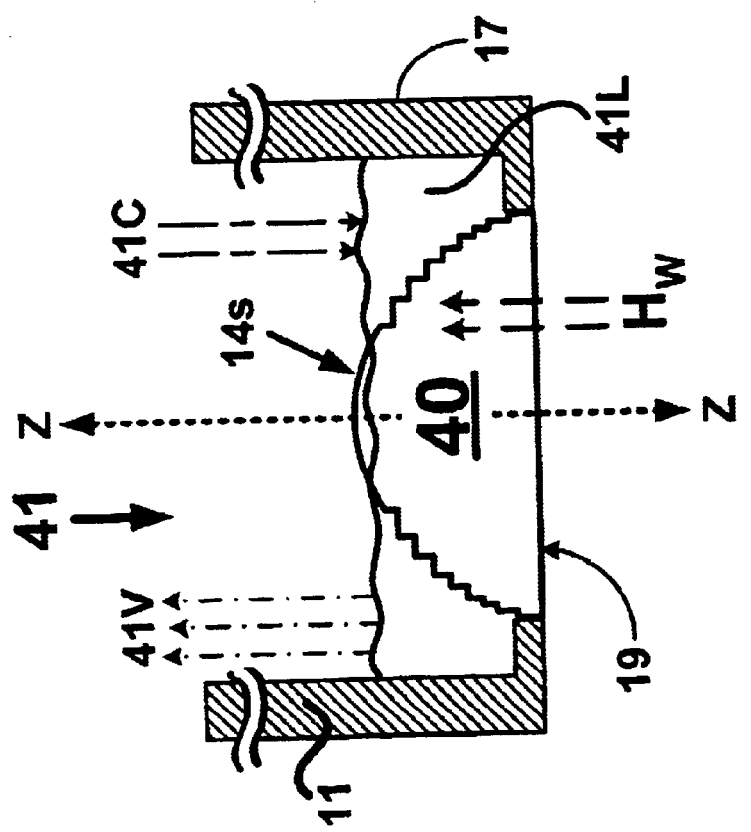

In FIGS. 10a and 10b, waste heat $H_w$ in a component 50 is dissipated by an a convection cooling effect and an evaporative cooling effect. In FIG. 10a, the waste heat $H_w$ is thermally conducted into the heat mass 11 and the thermal core 40. The waste heat $H_w$ is thermally conducted into the vanes 21, the fins 23, and the plug fins 42. An air flow F through the chamber 30, the primary slots P, the secondary slots S, and the plug slots 42s dissipates the waste heat $H_w$ from the heat mass 11. In FIG. 10b, the waste heat $H_w$ is thermally conducted into the thermal core 40 and causes the phase change liquid 41L to boil and convert from a liquid state (also 41L) to a vapor state 41V. The boiling of the phase change liquid 41L dissipates the waste heat $H_w$ from the thermal core 40. As the vapor 41V rises into the vapor chamber 41, the vapor 41V comes into contact with the surfaces (14a, 14b) that form a portion of the vapor chamber 41. Due to the aforementioned convection cooling of the heat mass 11, those surfaces (14a, 14b) are at a lower temperature than a temperature of the vapor 41V. As a result, the vapor 41V condenses 41C (i.e. the vapor 41V is cooled down) when it contacts the surfaces (14a, 14b) and is converted back to the liquid state 41L. The cycle of boiling, vaporization, and condensation of the phase change liquid 41L continues so long as a magnitude of the waste heat $H_w$ (e.g. in watts or in temperature) is sufficient to cause the phase change liquid 41L to boil.

In FIGS. 8a and 8b, the stepped face 14s of the thermal core 40 can have a profile (i.e. a surface shape) that includes but is not limited to an arcuate shape (FIG. 8a) or a sloped shape (FIG. 8b and FIG. 9). In FIGS. 10c and 10d, one advantage of the present invention is that the stepped face 14s allows the phase change liquid 41L to remain in contact with a substantial portion of the stepped face 14s when the cooling device 10 is tilted from a substantially horizontal position as depicted in FIG. 10c to a non-horizontal position as depicted in FIG. 10d where the axis Z makes an angle Δ with an axis Z'. As a result, in the tilted state of FIG. 10d, the phase change liquid 41L is in contact with a substantial portion of the stepped face 14s and will continue to boil and be converted into the vapor state 41V.

Preferably, the phase change liquid 41L is a liquid with a low boiling point so that the waste heat $H_w$ dissipated from the component 50 is more than sufficient to cause the phase change liquid 41L to boil and vaporize 41V. Suitable materials for he phase change liquid include but are not limited to water ($H_2O$), a fluorocarbon, carbon tetrachloride, a dielectric fluid, and ethylene. Examples of a dielectric fluid include but are not limited to FC16.

Each of the above listed liquids will achieve the phase change from the liquid phase 41L to the vapor phase 41V at different temperatures based on the pressure in the vapor chamber 41. For example, water will boil at about 95° C. when the vapor chamber 41 is at a pressure of about 84.6 Kpa or water will boil at about 45° C. when the vapor chamber 41 is at a pressure of about 9.6 Kpa. As another example, for water, the same result can be achieved at about 30° C. when the vapor chamber 41 is at a pressure of about 4.25 Kpa. A Steam Table published by John Wiley & Sons® is a good reference for calculating boiling points of various liquids under vacuum.

Figure 12A:
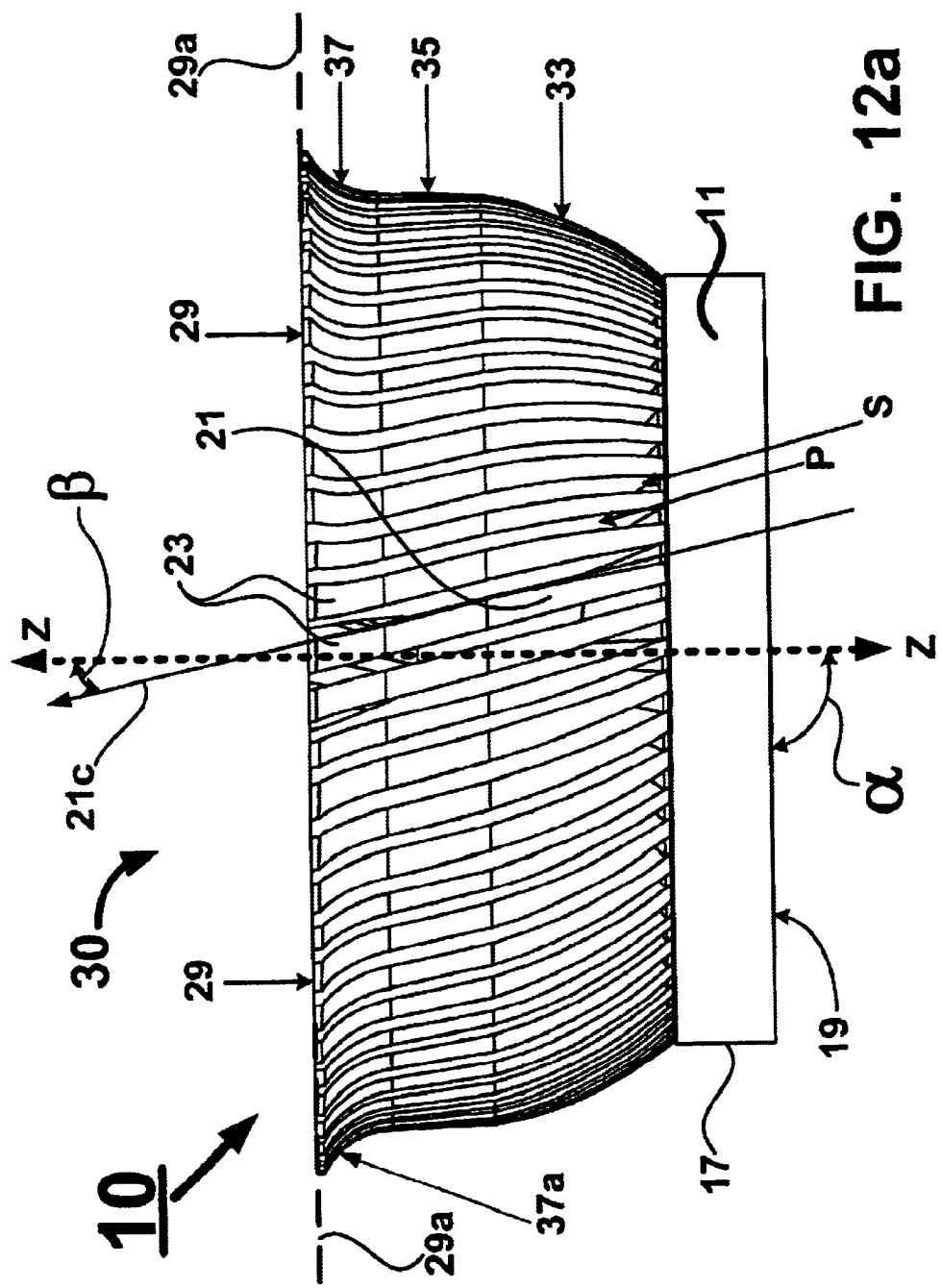
FIGS. 12a and 12b are side views of a cooling device with vanes inclined at an angle according to the present invention.
Figure 12B:
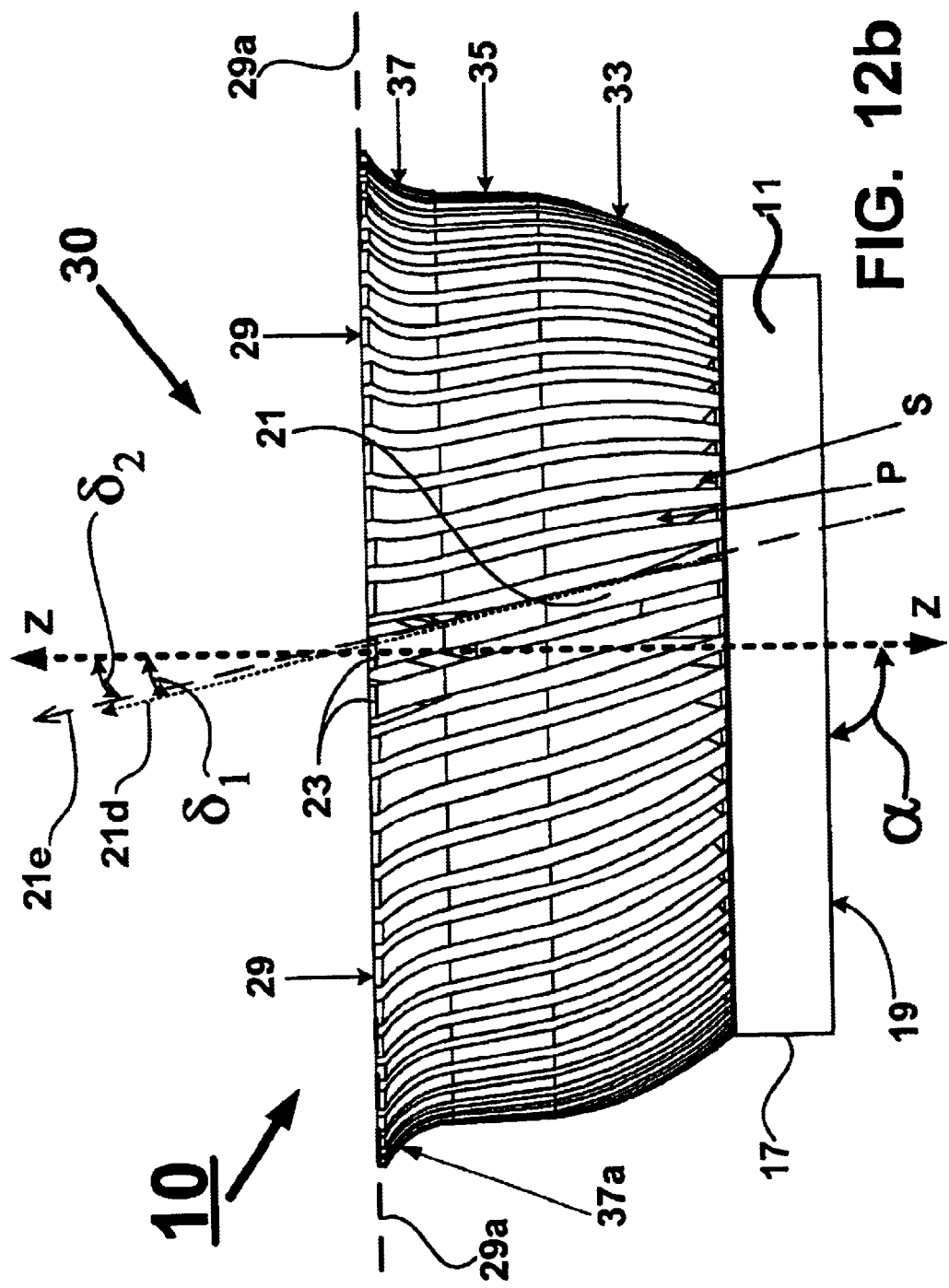

In FIGS. 12a and 12b, the vanes 21 can be inclined at angle with respect to the axis Z. In FIG. 12a, the vanes 21 are inclined at an angle β measured between a line 21c and the axis Z. The line 21c is measured along the primary slot P of the fins 23. The inclination of the angle β includes but is not limited to a range from about 0 (zero) degrees to about 25.0 degrees. In FIG. 12b, the angle at which the vanes 21 are inclined with respect to the axis Z includes a first angle $\delta_1$ measured between a line 21d and the axis Z and a second angle $\delta_2$ measured between a line 21e and the axis Z. The first angle $\delta_1$ is measured along the smooth radially outward portion 37 of the fins 23. The inclination of the first angle $\delta_1$ includes but is not limited to a range from about 0 (zero) degrees to about 25.0 degrees. The second angle $\delta_2$ is measured along the smooth curved portion 33 of the fins 23. The inclination of the second angle $\delta_2$ includes but is not limited to a range from about 5.0 degrees to about 18.0 degrees. Because the fins 23 are defined by the vanes 21, the fins 23 and the vanes 21 are inclined at the angles ($\beta, \delta_1$, and $\delta_2$) as described above.

Figure 4D:
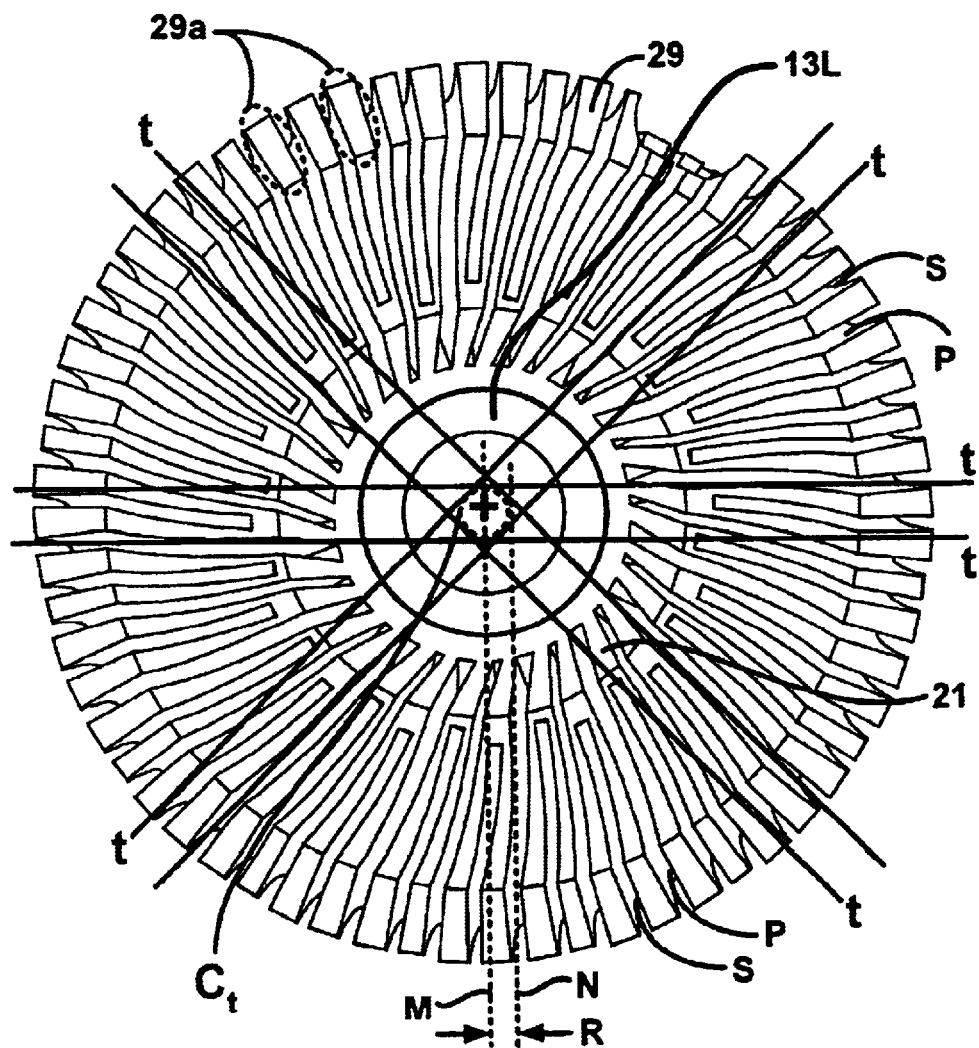
FIG. 4d is a top plan view depicting a cooling device including vanes with a tangential orientation according to the present invention.
Figure 4E:
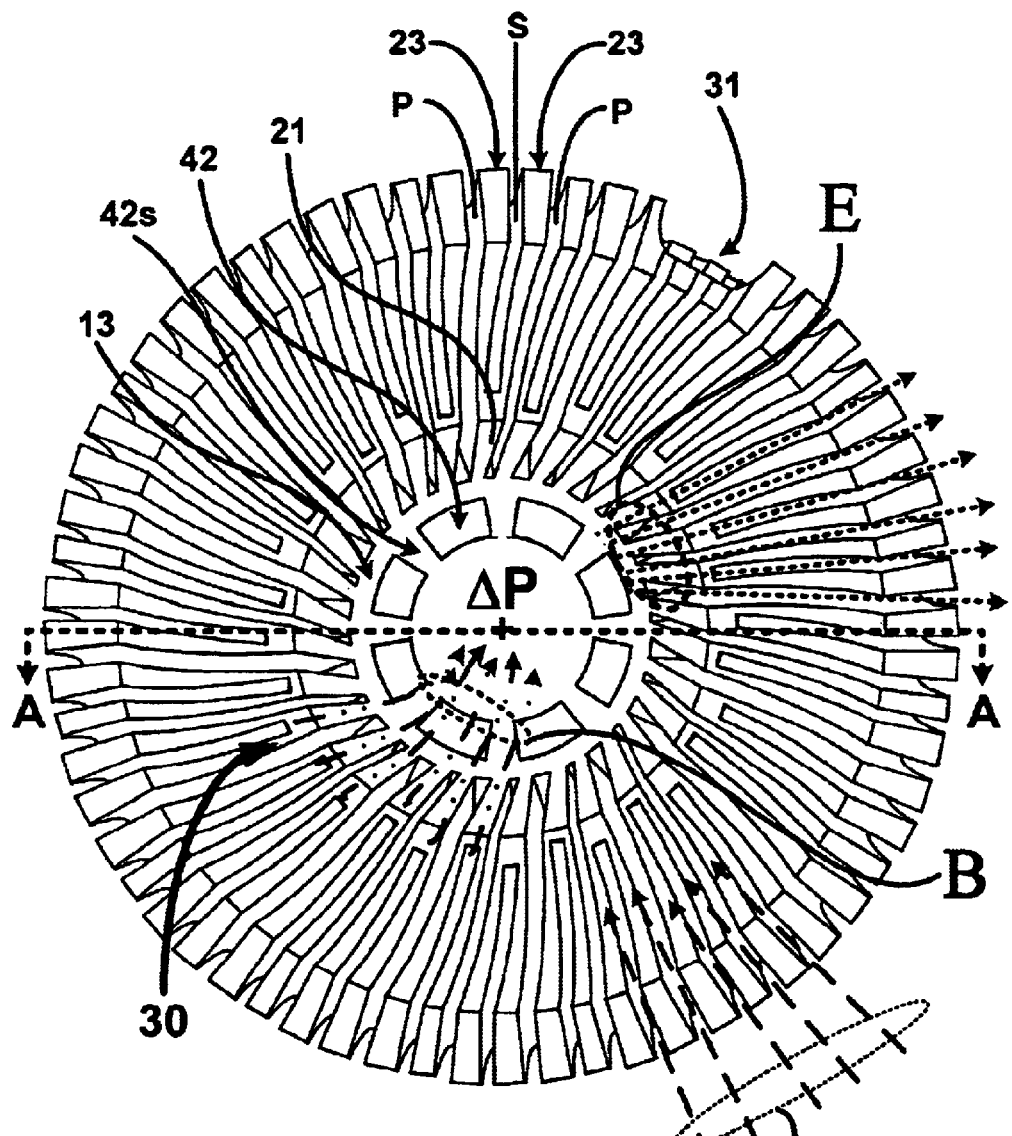
FIG. 4e is a top plan view of an air flow through a cooling device according to the present invention.

In FIG. 4d, the vanes 21 have a tangential orientation with respect to a circle $C_t$ (shown in dashed line) centered about the axis Z (shown as a "+") and having a predetermined diameter. In FIG. 4d, an example of the tangential orientation of the vanes 21 is illustrated by a plurality of the vanes 21 having tangent lines t drawn through their primary slots P and tangentially crossing a perimeter of the circle $C_t$. A line M through the axis Z (shown as a "+") and a parallel line N that also is tangential to the circle $C_t$ define a radius R therebetween. The predetermined diameter of the circle $C_t$ is two times the radius R (that is: $C_t=2*R$). The predetermined diameter includes but is not limited to a range from about 3.0 mm to about 12.0 mm.

In FIGS. 2, 4a, 4c, 4d, 12a, 12b, and 13 at least a portion of the top face 29 of the vanes 21 includes a substantially planar portion 29a (shown as a dashed line). Preferably the substantially planar portion 29a covers the entirety of the top face 29 as illustrated in FIG. 4d. One advantage of the substantially planar portion 29a of the top face 29 is that a fan can be mounted on the substantially planar portion 29a.

Figure 6A:
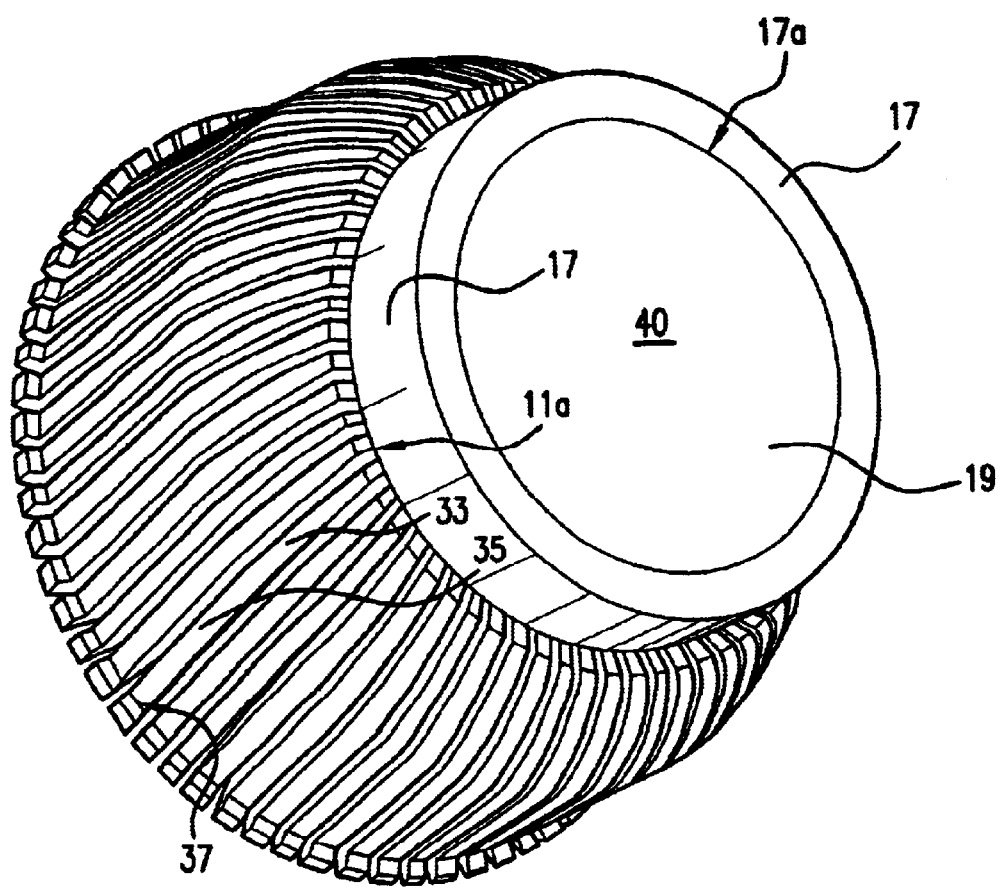
FIGS. 6a and 6b are a bottom profile views of a mounting surface of a thermal core according to the present invention.
Figure 6B:
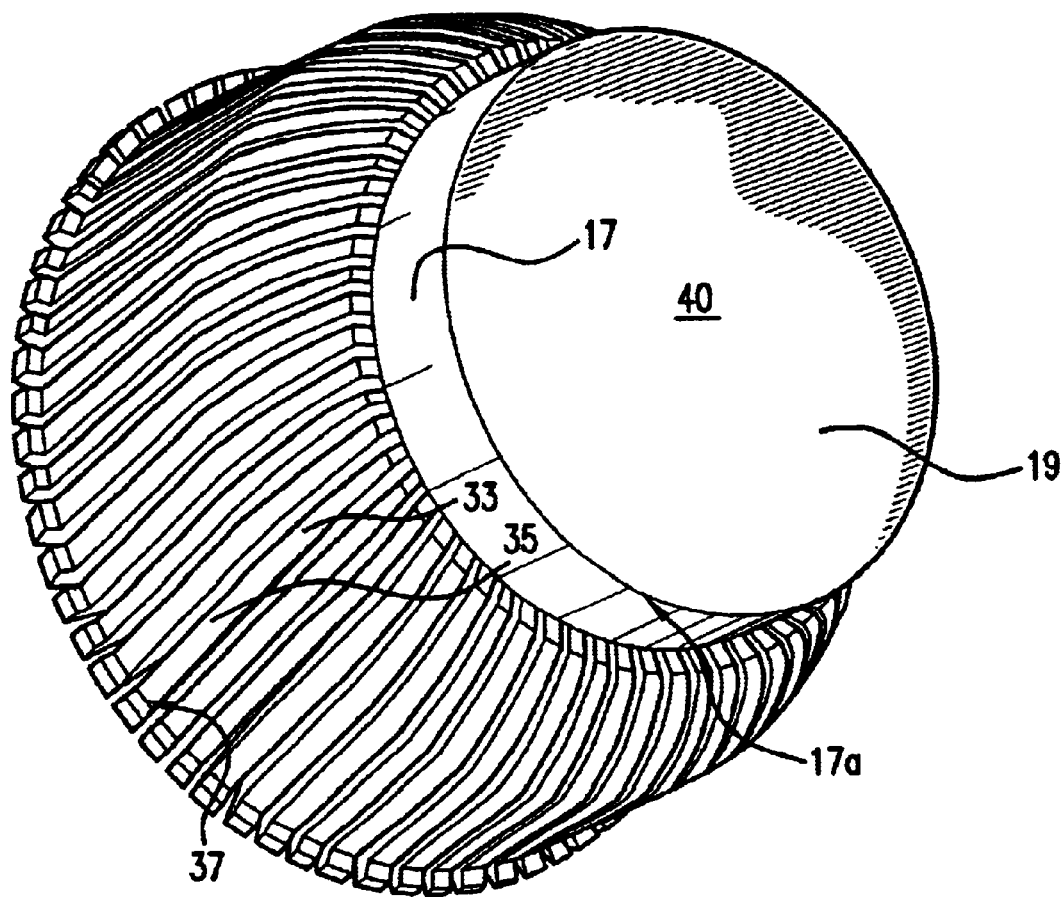

In FIGS. 4f, 5a, 6a, and 6b, the mounting surface 19 of the thermal core 40 is depicted as being substantially flush with the base 17 of the heat mass 11. However, the mounting surface 19 need not be flush with the base 17. For example, the mounting surface 19 can be inset from the base 17 or the mounting surface 19 can extend outward of the base 17. In FIGS. 5a and 6a, the base 17 includes an aperture 17a through which the thermal core 40 is inserted. However, the thermal core 40 can span an entire width of the base 17 as depicted in FIG. 6b such that the aperture 17a is coincident with an outer edge of the thermal core 40.

Figure 7:
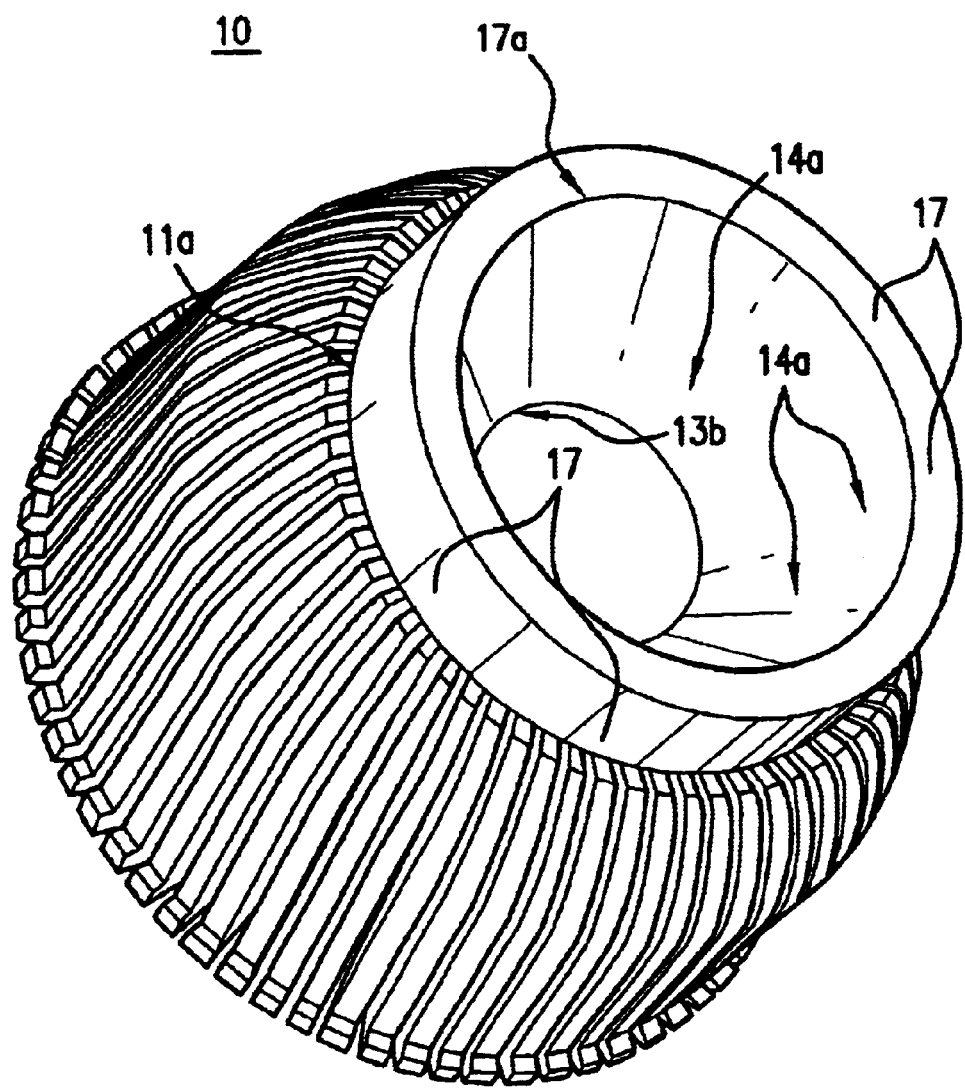
FIG. 7 is a bottom profile view of a chamber bore of a heat mass according to the present invention.
Figure 14:
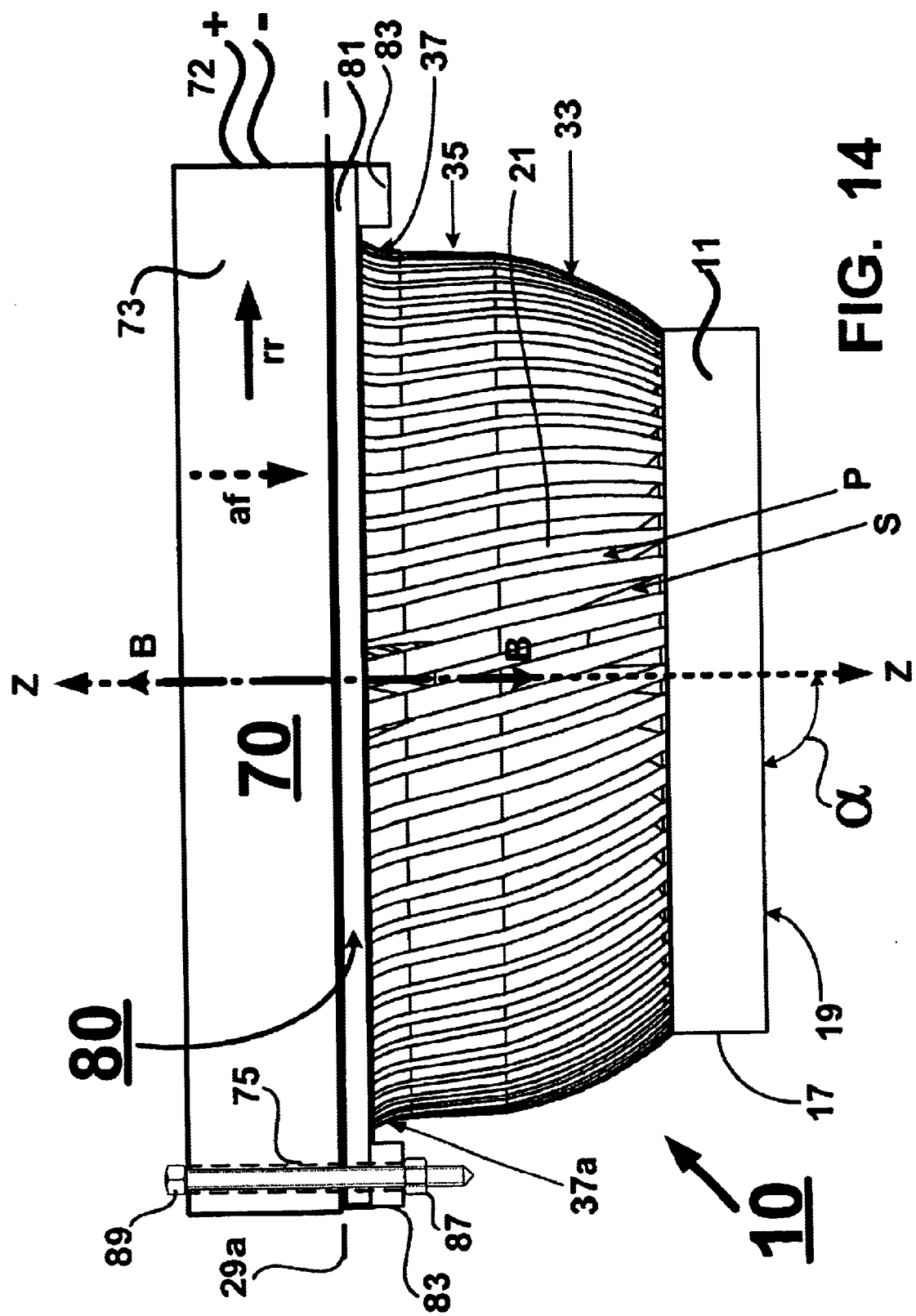
FIG. 14 is a side view of a fan mounted to a cooling device according to the present invention.
Figure 15:
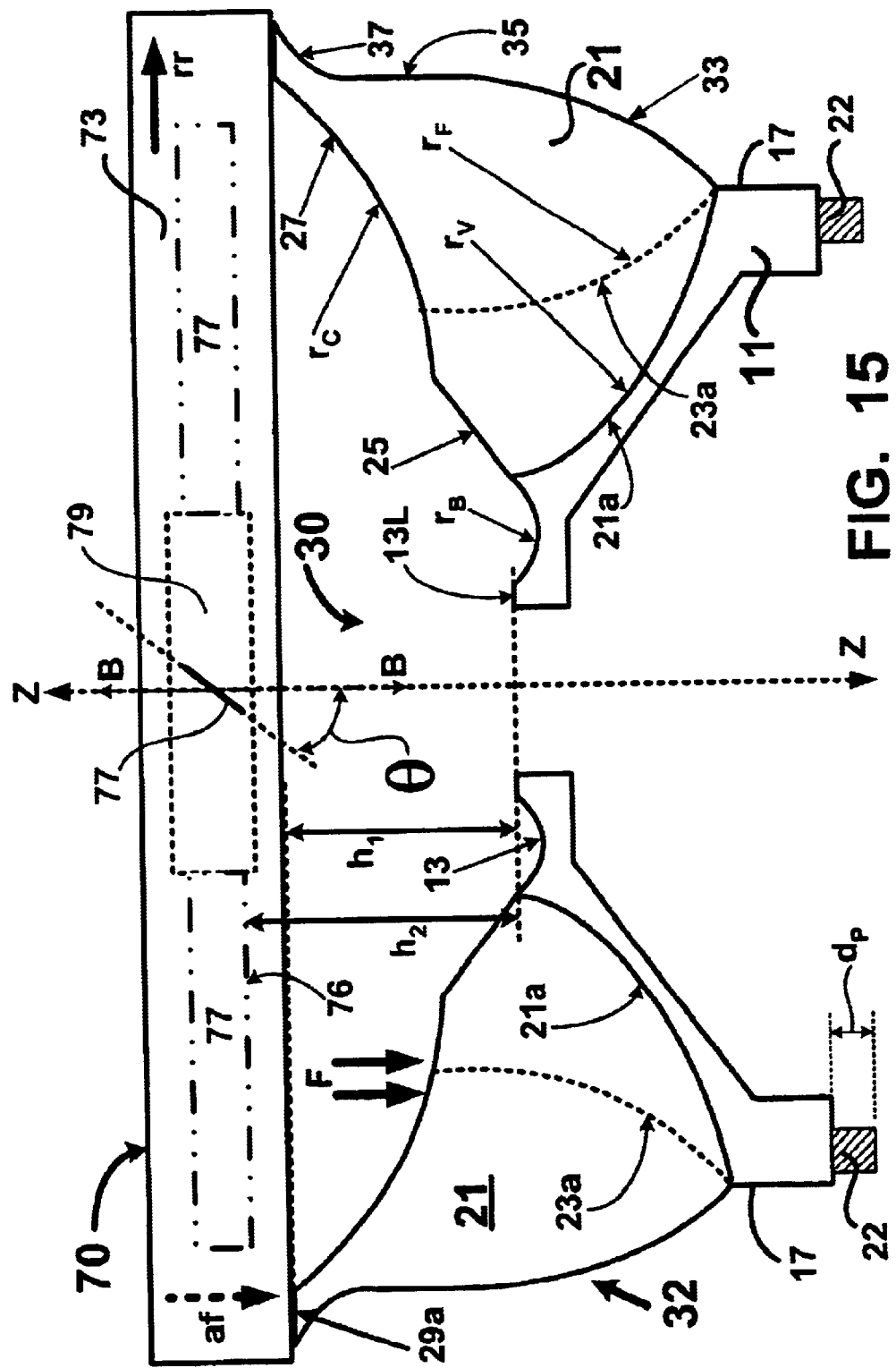
FIG. 15 is a cross-sectional view illustrating various dimensional relationships between a fan, fan blades, and a cooling device according to the present invention.

In FIG. 7, the taper bore 14a can gradually narrow in a direction towards the threaded bore 13b. The taper bore 14a can have a profile including but not limited to an arcuate profile as depicted in FIG. 7, a sloped profile as depicted in FIGS. 4f, 13, and 15, or combination of sloped and arcuate profiles. In FIGS. 14 and 15, a fan 70 is positioned to be mounted on the substantially planar portion 29a of the top face 29. The fan 70 generates an air flow (see reference letter F in FIG. 4f) into the chamber 30 of the cooling device 10 in a direction indicated by dashed arrow af. A shroud 73 houses a rotor hub 79 having a plurality of fan blades 77. The rotor hub 79 is rotatably mounted on a stator 71 and the fan blades 77 can rotate in a direction indicated by arrow rr. Several holes 75 through the shroud 77 are adapted to receive a fastener 89. The air flow F can also flow in a direction opposite of the arrow af such that the fan 70 sucks air through the cooling device 10 in a direction from the base 17 to the top edge 29 as opposed to blowing air into the chamber 30 in a direction from the top edge 29 to the base 17 as indicated by the arrow af.

A mounting ring 80 including a frame 81 and several mounting fixtures 83 is abutted against a surface 37a of the smooth radially outward portion 37. The diameter of the smooth radially outward portion 37 at the surface 37a is greater than an inside diameter of the frame 81 of the mounting ring 80 so that the frame 81 can be urged into snug contact with the smooth radially outward portion 37 without sliding off of the vanes and fins (21, 23). The only way to slide the mounting ring 80 off of the vanes and fins (21, 23) is in the direction of the base 17 because the diameter of the vanes and fins (21, 23) narrows in that direction.

The mounting fixtures 83 receive the fastener 89 and optionally an additional fastener 87 such that the fan 70 is firmly connected with the top face 29 as illustrated in FIG. 14. The fasteners (87, 89) can be a nut and bolt as shown or another type of fastener. Preferably, a rotational axis B of the fan 70 is colinear with the axis Z of the cooling device 10 when the fan 70 is connected with the mounting ring 80. Examples of suitable materials for the mounting ring 80 include but are not limited to metals, plastics, or ceramics. The mounting ring 80 can be produced by machining, casting, molding, and pressure diecasting.

Although the previous discussion has focused on fasteners as one means of connecting the mounting ring 80 with the fan 70, the present invention is not to be construed as being limited to fasteners only. For instance, a latch on the fan could mate with a complementary latching profile on the mounting ring 80. Because the mounting ring 80 can be formed by an injection molding process, many possibilities exist for effectuating the mounting of the fan 70 to the mounting ring 80 and fasteners are an example of one of those many possibilities.

In FIG. 14, the fan 70 is shown mounted on the substantially planar portion 29a of the top face 29. For purposes of illustration, only one set of fasteners (87, 89) are shown installed through the holes 75 and the mounting fixtures 83. A power lead 72 of the fan 70 is positioned so that it is not necessary for the power lead 72 to be routed through or to come into contact with the vanes or fins (21, 23). Although shown with only two wires (+ and −) the power lead 72 can include additional wires such as one or more additional wires for communicating with a circuit that controls the fan 70 (e.g turning fan 70 on or off, or controlling fan speed) or for determining if the fan 70 is operating properly.

Although only one fan 70 is shown in FIG. 14, two or more fans 70 can be stacked one upon the other with the holes 75 aligned so that a longer fastener 89 can be inserted through the holes 75 an into the mounting fixtures 83 of the mounting ring 80. Therefore, another advantage of the cooling device 10 of the present invention is that a plurality of fans 70 can be used to generate the air flow F into the chamber 30. The use of more than one fan 70 allows for redundant cooling if one or more fans should fail. In contrast, prior fan assisted heat sinks in which the fan is mounted in a cavity formed by the fins, it is very difficult to mount more than one fan in the cavity. Moreover, because the fan 70 is not mounted in the chamber 30, the risks associated with routing the power lead 72 through the vanes 21 is eliminated because the fan 70 is mounted on the top face 29.

An additional advantage to mounting the fan 70 on the top face is that if one or more of the vanes and fins (21, 23) are damaged, the blades 77 will not come into contact with a damaged vane or fin (21, 23) because the fan blades 77 are not positioned in the chamber 30; therefore, potential damage to the blades 77 or the fan 70 is eliminated. In FIGS. 4a, 4b, 4d and 4e, a notch 31 can be formed in the fins 23. The notch 31 can have a shape the complements an indexing tab (not shown) on the shroud 73 so that when the fan 70 is mounted on the top face 29, the indexing tab mates with the notch 31. The notch 31 can be used to ensure proper orientation of the fan 70 with respect to the cooling device 10 and/or to prevent relative movement between the shroud 73 and the cooling device 10.

In FIG. 15, the tangential orientation of the vanes 21, as was described above in reference to FIG. 4d, can be determined by two factors. A first factor is a height $h_1$ from the top of the land 13L to the top face 29. For example, when the height $h_1$ is about 7.5 mm, the vanes 21 can be tangential to the circle $C_t$ having a diameter of about 6.5 mm. On the other hand, a second factor is a height $h_2$ from the top of the land 13L to a bottom 76 of the fan blades 77. For instance, the diameter of the circle $C_t$ can be from about 3.0 mm to about 12.0 mm when the height $h_2$ varies from about 2.0 mm to about 8.5 mm. The above are examples only and the heights ($h_1$, $h_2$) are not to be construed as being limited to the ranges set forth above. As described above, the fan blades 77 are not positioned in the chamber 30 and positioned above the top face 29 of the vanes and fins (21, 23) so that the fan blades 77 will not come into contact with the vanes or fins (21, 23).

The angle ($\beta$, $\delta_1$, and $\delta_2$) at which the vanes 21 are inclined relative to the axis Z as described above can be set to substantially match or closely approximate a pitch angle $\theta$ of the fan blades 77 as illustrated in FIG. 15. On the other hand, the angles ($\beta$, $\delta_1$, and $\delta_2$) can be set so that they are within a predetermined range of the pitch angle $\theta$. For example, the pitch angle $\theta$ can be about 15.0 degrees and the angle $\beta$ can be about 17.0 degrees or the pitch angle $\theta$ can be about 12.0 degrees and the angle $\delta_1$ can be about 10.0 degrees and the angle $\delta_2$ can be about 8.0 degrees.

Another advantage of the cooling device 10 of the present invention is that the aforementioned tangential orientation and inclination of the vanes 21 and the aerodynamically profiled first and second portions (25, 27) of the inner wall 26 provide a low resistance path to the air flow F thereby reducing airflow shock noise. Additionally, because of the low resistance path, the fan 70 can be a lower RPM fan which produces lower noise levels and can be operated on less power than a fan operating at a higher RPM.

The cross-sectional view of the cooling device 10 in FIG. 15 also depicts radiuses for the arcuate shapes of the boss 13, the second portion 27, the first arcuate surface profile 21a, and the second arcuate surface profile 23a.

The arcuate profile of the boss 13 can have a radius $r_B$ that is dependent in part on a desired thermal mass for the boss 13. For instance, for a thermal mass of about 50.0 grams, the arcuate profile of the boss 13 has a radius $r_B$ of about 2.5 mm. The actual value for $r_B$ will be application dependent and the above values are examples only. The present invention is not to be construed as being limited to the values set forth above.

Furthermore, the arcuate surface profiles for the first and second arcuate surface profiles (21a, 23a) have a radius of $r_V$ and $r_F$ respectively. For example, the radius $r_V$ can be from about 38.0 mm to about 45.0 mm and the radius $r_F$ can be from about 31.0 mm to about 38.0 mm. The second portion 27 of the inner wall 26 has a radius $r_C$. The radius $r_C$ can be about 20.0 mm, for example. The actual values for $r_V$, $r_C$, $r_F$ and $r_B$ will be application dependent and the above values are examples only. The present invention is not to be construed as being limited to the values set forth above.

The above mentioned radiuses can be determined by a machining process used to form the cooling device 10. Reference points for the radiuses need not be relative to a point on the cooling device 10. The radiuses $r_B$ and $r_C$ can be formed by a forging process. They can also be machined or produced using a diecasting process. The radiuses $r_V$ and $r_F$ can be formed by machining after forging the cooling device 10 from a blank of material.

Figure 16:
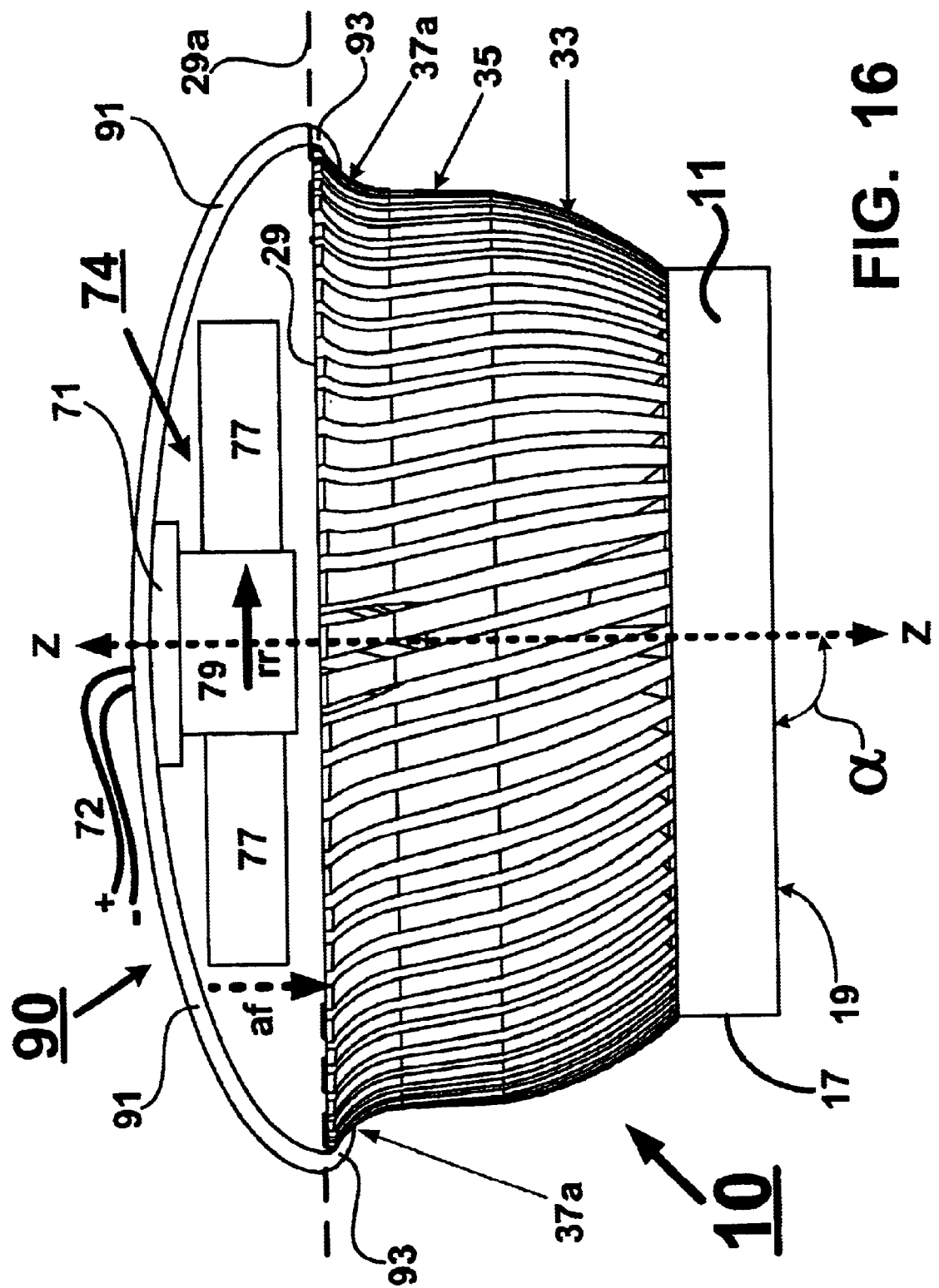
FIG. 16 is a side view of a space frame for mounting a fan to a cooling device according to the present invention.

In one embodiment of the present invention as illustrated in FIG. 16, a fan 74 without a shroud (i.e. it lacks the shroud 73 of FIGS. 14 and 15) is positioned over the top face 29 of the cooling device 10 by a space frame 90. A stator 71 of the fan 74 is connected with the space frame 90 and a plurality of arms 91 span the width of the top face 29 and fingers 93 at the ends of the arms 91 clamp the space frame 90 to the cooling device 10 approximately at the surface 37a of the smooth radially outward portion 37. Consequently, a hub 79 and blades 77 of the fan 74 are positioned over the chamber 30 so that an air flow from the fan 74 can enter the chamber 30 as was described above. Moreover, power leads 72 from the fan 74 can be routed away from the fins and vanes (21, 23) of the cooling device 10 and away from the fan blades 77. The space frame 90 can be integrally formed with the stator 71 or the space frame 90 can be made from a metal or plastic material, preferably plastic because it is electrically non-conductive. The space frame 90 positions the fan 74 over the chamber 30 so that the fan blades 77 are not positioned in the chamber 30 and will not come into contact with the vanes or fins (21, 23).

Figure 17:
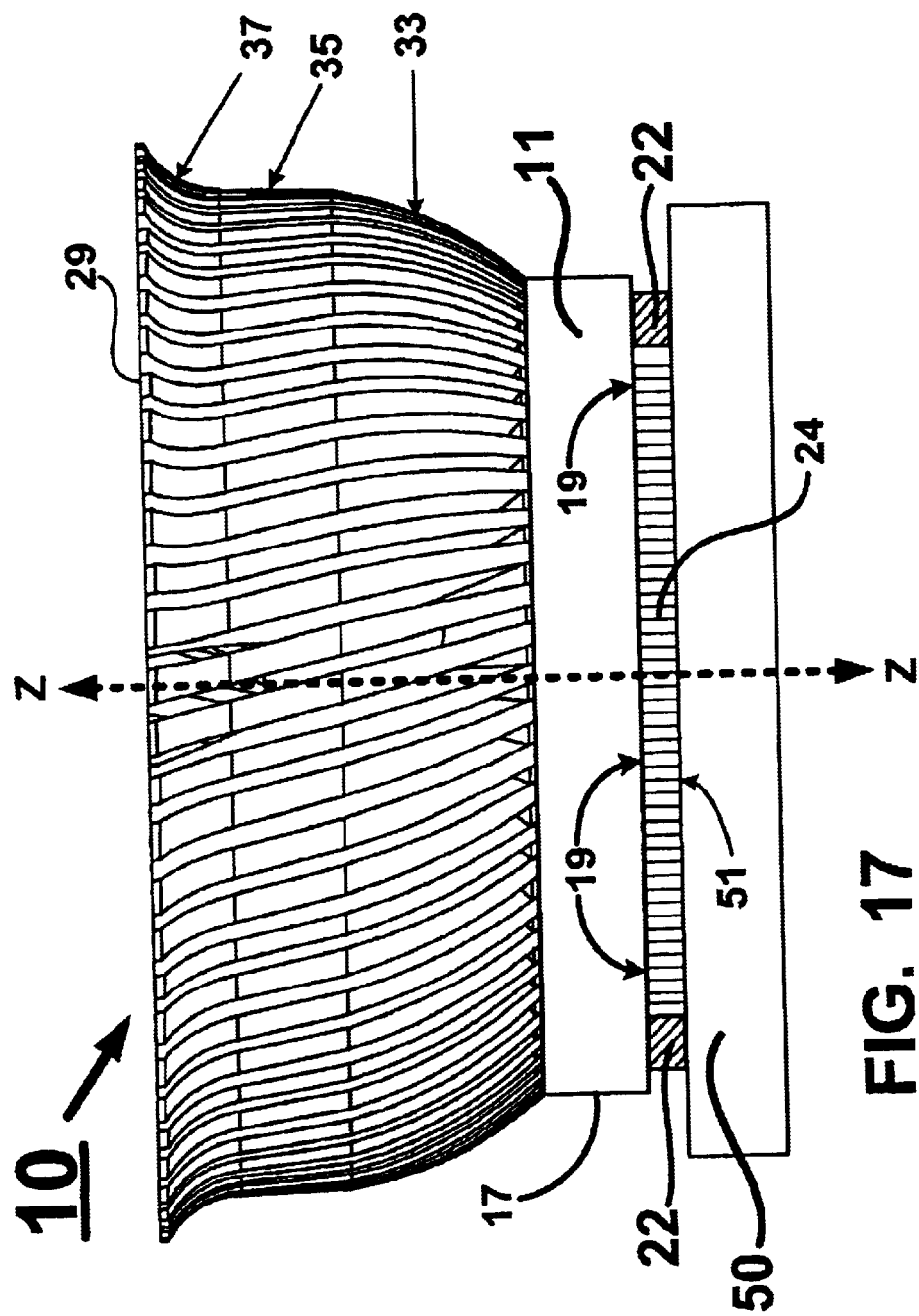
FIG. 17 is a side view of a cooling device with a base that includes projections that protect a thermal interface material according to the present invention.

In FIG. 15, the base 17 of the cooling device 10 includes at least two projections 22 that extend outward of the base 17. In FIG. 17, a thermal interface material 24 is in contact with the mounting surface 19 of the heat spreader 40 and is positioned between the projections 22. The projections 22 protect the thermal interface material 24 from damage when the mounting surface 19 is in contact with a component 50. The projections 22 can also protect the thermal interface material 24 from being damaged during manufacturing, transit, and/or handling. The thermal interface material 24 is in contact with a component face 51 of the component 50 and the thermal interface material 24 provides a thermally conductive path for waste heat from the component face 51 to be communicated through the mounting surface 19 and into the thermal core 40 and the heat mass 11 (see FIG. 10a). The projections 22 prevent the thermal interface material 24 from being crushed, deformed, or otherwise damaged when the cooling device 10 is mounted on the component 50.

The projections 22 extend outward of the base 17 by a distance $d_P$. The distance $d_P$ will be application dependent and will depend on among other things a thickness of the thermal interface material 24. The distance $d_P$ can be from about 0.2 mm to about 1.0 mm. Preferably, the mounting surface 19 is a substantially planar surface (i.e. it is substantially flat) and the mounting surface 19 is substantially perpendicular to the axis Z (i.e. about 90.0 degrees, see angle $\alpha$ in FIG. 16).

Additionally, the thermal interface material 24 seals micro voids (i.e. gaps) between the mounting surface 19 and the component face 51 thereby enhancing thermal transfer from the component 50 to the cooling device 10. Suitable materials for the thermal interface material 24 include but are not limited to a thermally conductive paste, a thermally conductive grease, silicone, paraffin, a phase transition material, graphite, a coated aluminum foil, and carbon fiber. The thermal interface material 24 can be screen printed or pasted to the mounting surface 19 of the heat spreader 40, for example.

In another embodiment of the present invention, as illustrated in FIGS. 8a, 8b, and 9, the mounting surface 19 of the thermal core 40 can include the above mentioned projections 22 that extend outward of the mounting surface 19 by the distance $d_P$ and are operative to protect the thermal interface material 24 from damage as described above. Preferably, either the base 17 or the mounting surface 19 include the projections 22.

Figure 18:
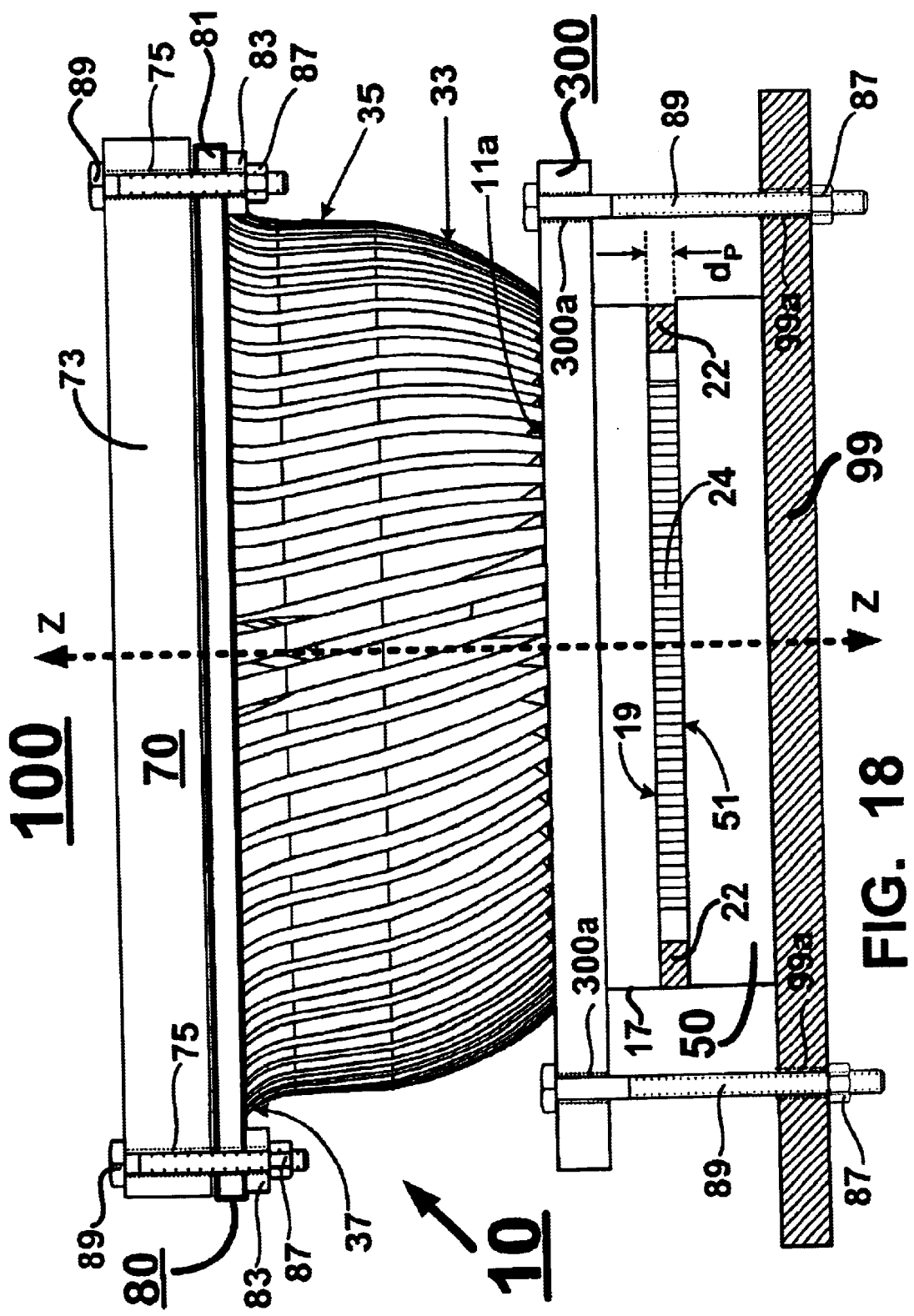
FIG. 18 is a side view of a system for dissipating heat according to the present invention.

In FIG. 18, a system for dissipating heat 100 includes the cooling device 10 as described above, a fan 70 connected with the top face 29 as described above, a component 50 to be cooled by the cooling device 10, and a base mount 300.

A component face 51 of the component 50 is in contact with the mounting surface 19. On the other hand, as described above in reference to FIG. 10*a*, a thermal interface material 24 may be positioned intermediate between the component face 51 and the mounting surface 19.

In either case, waste heat is thermally communicated through the component face 51 into the mounting surface 19 either by direct contact between the component face 51 and the mounting surface 19 or via the thermal interface material 24. The base mount 300 urges the mounting surface 19 and the component face 51 into contact with each other so that waste heat from the component 50 is thermally communicated into the cooling device 10.

In FIG. 4*f*, the mounting surface 19 of the thermal core 40 includes the projections 22 that extend outward of the mounting surface 19 and the thermal interface material 24 is positioned intermediate between the projections 22 as was described above. Alternatively, in FIG. 17, the base 17 can include the projections 22 that extend outward of the base 17 and the thermal interface material 24 can be connected with the mounting surface 19 and positioned intermediate between the projections 22 as described above.

In another embodiment of the present invention, the component 50 is carried by a support unit 99. The support unit includes but is not limited to a socket, a substrate, and a PC board. The socket can be mounted to a PC board in a manner that is well understood in the electronics art. For instance the component can be a micro processor that is inserted into a socket that is solder onto a PC board. The base mount 300 is removably connected with the support unit 99.

On the other hand, the support unit can be a PC board on which the component 50 is soldered or otherwise electrically connected with. Although the present invention has described the cooling device 10 in terms of its usefulness in dissipating waste heat from electronic components, the cooling device 10 and the system 100 are not to be construed as being limited to cooling electronic devices exclusively. Accordingly, the component 50 can be any heat generating device from which it is desirable to remove heat. To that end, the support unit 99 need not be a PC board or a socket. The support unit 99 can be a substrate that carries the component 50. The component 50 may or may not be in electrical communication with the substrate.

In FIG. 18, the base mount 300 is a base plate such as the type used for mounting a heat sink to a PC board. A plurality of holes 300*a* formed in the base mount 300 and a plurality of holes 99*a* formed in the support unit 99 receive fasteners (87, 89) that removably connect the base mount 300 with the support unit 99. Although a nut and bolt are shown, other fasteners and other fastening methods can be used to removably connect the base mount 300 with the support unit 99.

The system 100 can include a shroudless fan 74 as was described above in reference to FIG. 16. The shroudless fan 74 includes the space frame 90 for supporting the fan 74 and for positioning the shroudless fan 74 adjacent to the top face 29 and over the chamber 30 so that the air flow af enters the chamber 30. As previously mentioned, the space frame 90 includes a plurality of arms 91 that span the width of the top face 29 and fingers 93 on the arms 91 clamp the space frame 90 to the smooth radially outward portion 37 of the outer wall 32.

Preferably, the heat mass 11, the base 17, and the vanes 21 are homogeneously formed. An extrusion process can be used to homogeneously form the heat mass 11, the base 17, and the vanes 21. The heat mass 11 can be made from a variety of thermally conductive materials including but not limited to copper (Cu), alloys of copper, electrolytic copper, aluminum (Al), alloys of aluminum, ceramics, gold (Au), alloys of gold, and silicon (Si) substrates. An exemplary material for the cooling device 10 is aluminum 1060 or aluminum 6063. For example, the heat mass 11, the base 17, and the vanes 21 can be homogeneously formed from an extruded rod or from a forged nutshell.

Similarly, the thermal core 40 can be made from a variety of materials including but not limited to copper (Cu), alloys of copper, silver (Ag), alloys of silver, silicon (Si), gold (Ag), alloys of gold, graphite, a carbon fiber material, and a carbon fiber reinforced material.

Preferably, the heat mass 11 and the thermal core 40 are fixedly connected to each other. Moreover, the connection between the heat mass 11 and the thermal core 40 should be leak proof to prevent the phase change liquid 41L from leaking out of the vapor chamber 41. A process including but not limited to brazing, welding, and friction stir welding (FSW) can be used to fixedly connect the heat mass 11 and the thermal core 40.

Figure 11A:
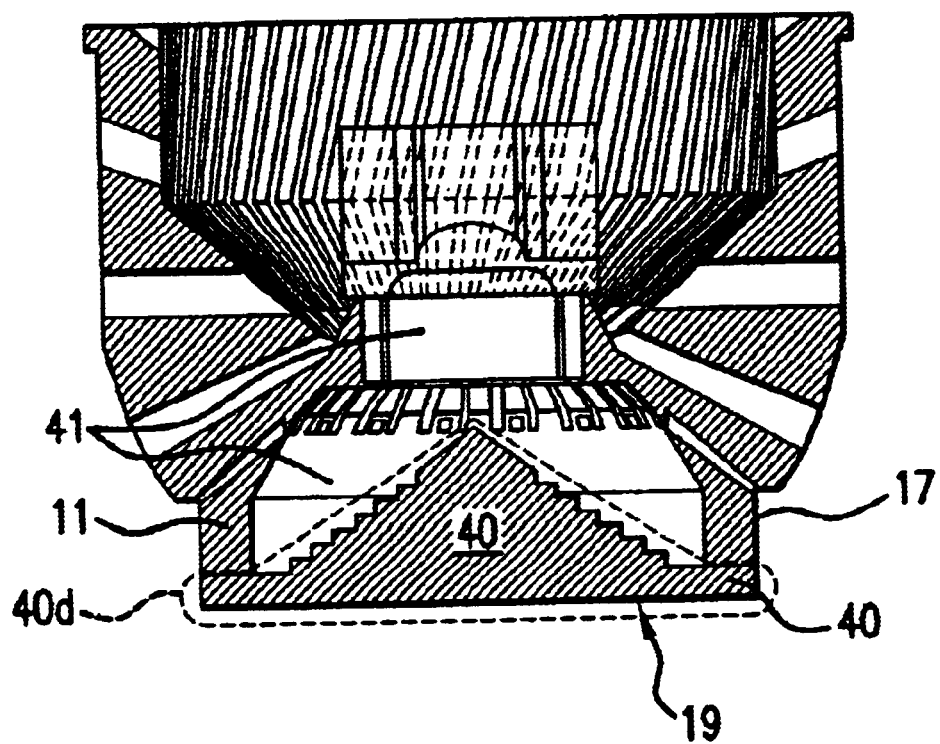
FIGS. 11a through 11c are cross-sectional views depicting a connection of a thermal core with a heat mass according to the present invention.
Figure 11B:
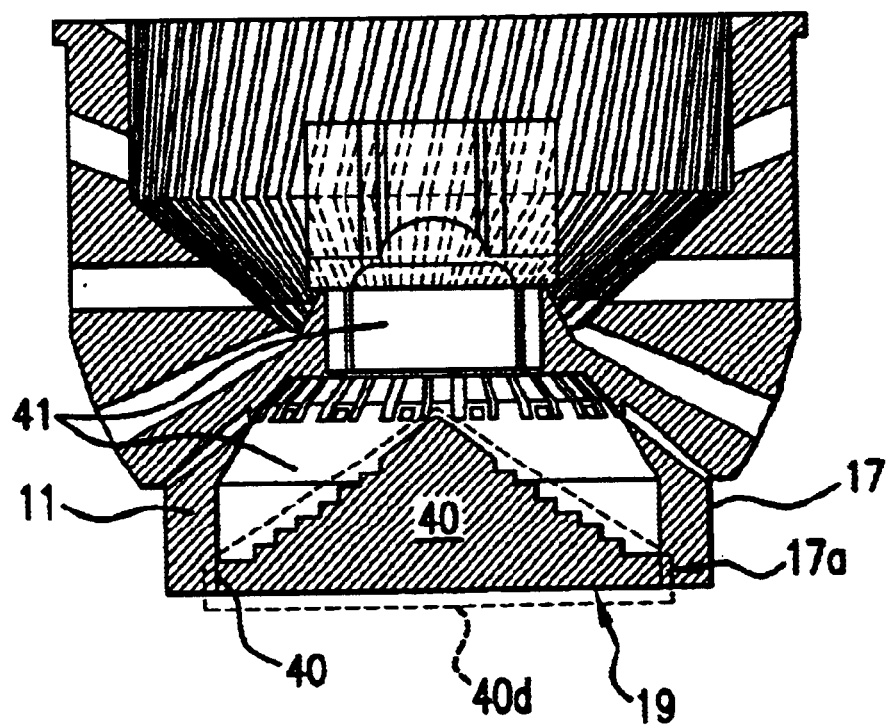
Figure 11C:
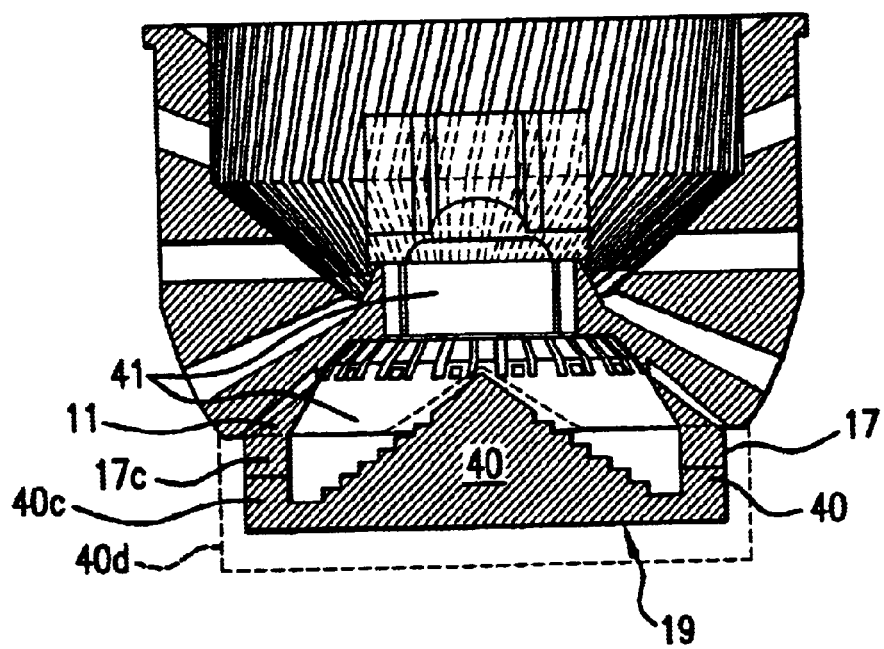

In FIGS. 11*a* through 11*c*, examples of different configurations for mounting the thermal core 40 to the base 17 of the heat mass are depicted by a dashed line 40*d*. In FIG. 11*a*, the thermal core 40 is mounted directly to the base 17. In FIG. 11*b*, the thermal core 40 is inserted into the aperture 17*a* of the base 17 (see FIG. 6*a*). In FIG. 17*c*, the thermal core 40 is mounted directly to the base 17; however, a portion 40*c* of the thermal core 40 has a shape that complements a shape 17*c* of the base 17 and those complementary shapes (17*c*, 40*c*) allow for an easy mating of the thermal core 40 with the base 17.

The cooling device 10 can be manufactured by a variety of processes including but not limited to those listed below. First, the cooling device 10 can be completely machining from an extruded bar stock. Second, a diecasting, forging, or pressing process can be used to form either one or both of the internal and external features (26, 32) of the cooling device 10, followed by a machining process to form the base 17, the mounting surface 19 and the projections 22. Next cutting wheels can be used to form the primary P and secondary S slots for the vanes 21 and the fins 23 respectively, followed by deburring and degreasing. Third, impact forging the complete cooling device 10 including the vanes 21 and fins 23. Fourth, pressure diecasting the complete cooling device 10 including the vanes 21 and fins 23.

The plug 45 can be manufactured in the same manner described above for the cooling device 10 and similar or identical materials can be used for both the heat mass 11 and the plug 45.

As an example, a nutshell shape for the heat mass 11 can be forged. Next the base (17, 17*a*), the chamber bore 14*a*, threaded bore 13*b* and the land 13L can be turned on a lathe or milled. The threaded bore 13*b* can then be threaded. The vanes and fins (21, 23) can be formed using a slitting saw. The base mount 300 can be press fitted to the base (17, 17*a*) of the heat mass 11 and then crimped on to the heat mass to withstand an attachment load created when the cooling device 10 is mounted to the component 50. The thermal core 40 can be soldered to the base 17 to form the vapor chamber 41, followed by cleaning the vapor chamber 41, and then filling the vapor chamber 41 with the phase change liquid 41L. The cooling device 10 is then placed in a vacuum chamber, the plug 45 is coated with the sealant material 44*s*, and the gasket 44*g* is installed on the threaded neck 49. Next, the plug 45 is tightened to about 21 in-lbs of torque to seal the vapor chamber 41. Preferably, the cooling device should be kept inside the vacuum chamber for about 5.0 minutes or longer to allow the sealant material 44s to cure. After the curing, the cooling device 10 can be removed from the vacuum chamber and the phase change liquid 41L will be sealed in the vapor chamber 41 at a low pressure.

An exemplary model of the cooling device 10 was created with a diameter of 70 mm at the top face 29 and a diameter of 60 mm at the bottom surface 11a of the heat mass 11. The base 17 had a diameter of 52 mm and height of 6.5 mm from the bottom surface 11a. The cooling device 10 had a total height from the mounting surface 19 to the top face 29 of about 49 mm. The heat mass 11 had a total height of about 25 mm from the mounting surface 19 to a top of the boss 13. The smooth curved portion 33 had a radius of about 20 mm and the draft portion 35 had a diameter of about 65 mm.

Moreover, for the fan 70, a Delta® fan, model number EFB0612VHB, and having dimensions of 60 mm×60 mm×15 mm in length, breadth, and height was mounted to the cooling device 10 as illustrated in FIG. 14. The cooling device 10 was then mounted on a processor carried by a PGA 478 connector that was soldered onto a mother board. The processor had a top surface of approximately 33 mm×33 mm and a thermal output of 36 watts. The cooling device 10 as described in this paragraph was capable of maintaining the case temperature of the processor at 45.0° C. at an ambient temperature of 30.0° C. Based on the above temperatures, a temperature difference of 15.0° C. for 70 watts of thermal power results in an estimated thermal resistance for the cooling device 10 of:

0.2143° C./watt; (15.0° C./70 watts=0.2143° C./watt).

Although several embodiments of the present invention have been disclosed and illustrated, the invention is not limited to the specific forms or arrangements of parts so described and illustrated. The invention is only limited by the claims.

What is claimed is:

1. A cooling device for dissipating heat from a component, comprising:
a heat mass including a base, a chamber bore extending inward of the base, a boss symmetrically positioned about an axis of the heat mass and including a land and a threaded bore extending through the boss to the chamber bore;
a thermal core connected with the base and including a stepped face that extends into the chamber bore and a mounting surface adapted to thermally connect the thermal core and the heat mass with the component;
a plug including a plurality of plug fins that are spaced apart to define a plug slot between adjacent plug fins, a step face, a threaded neck extending from the step face and adapted to be threaded into the threaded bore until the step face is contact with the land, and a plug cavity formed in the threaded neck;
a vapor chamber defined by the plug cavity, the chamber bore, and the stepped face;
a phase change liquid in contact with a portion of the stepped face and sealed in the vapor chamber at a low pressure;
a plurality of vanes connected with the heat mass and spaced apart to define a primary slot therebetween that extends to the heat mass, the vanes have a surface area that increases in a radially outward direction from the axis, the vanes including at least one secondary slot extending through a portion of each vane to define a plurality of fins in each vane,
the vanes including a top face, an aerodynamically profiled inner wall including a first portion extending from the boss and terminating at a second portion that extends to the top face, the inner walls of the vanes defining a chamber that surrounds the boss, an outer wall having a surface profile that widens from the base to the top face and includes therebetween a smooth curved portion, a draft portion, and a smooth radially outward portion; and
wherein heat is dissipated from the component by heat in the thermal core converting the phase change liquid from a liquid state to a vapor state and by an air flow through the chamber, the primary slots, the secondary slots, and the plug slots.

2. The cooling device as set forth in claim 1, wherein the heat mass is made from a material selected from the group consisting of aluminum, an aluminum alloy, copper, a copper alloy, an electrolytic copper, gold, a gold alloy, silicon substrate, and a ceramic material.

3. The cooling device as set forth in claim 1, wherein the thermal core is made from a material selected from the group consisting of copper, a copper alloy, silver, a silver alloy, silicon, gold, a gold alloy, graphite, a carbon fiber material, and a carbon fiber reinforced material.

4. The cooling device as set forth in claim 1 and further comprising a thermal interface material in contact with the mounting surface.

5. The cooling device as set forth in claim 1 and further comprising at least one fan positioned adjacent to the top face and positioned over the chamber so that an air flow generated by the fan produces the air flow through the chamber.

6. The cooling device as set forth in claim 5 and further comprising a mounting ring adapted to abut against the smooth radially outward portion and including a plurality of mounting fixtures adapted to receive a fastener that connects the fan with the mounting ring such that the fan is fixedly connected with the top face.

7. The cooling device as set forth in claim 6, wherein at least a portion of the top face is a substantially planar portion and the fan is seated on the substantially planar portion when the fan is connected with the top face.

8. The cooling device as set forth in claim 1 and further comprising a sealant material in contact with the threaded bore and the threaded neck and operative to seal the phase change liquid in the vapor chamber.

9. The cooling device as set forth in claim 8, wherein the sealant material thermally isolates the plug from the heat mass.

10. The cooling device as set forth in claim 1 and further comprising a gasket positioned between the land and the step face and operative to seal the phase change liquid in the vapor chamber.

11. The cooling device as set forth in claim 1, wherein the phase change liquid is a material selected from the group consisting of water, a fluorocarbon, carbon tetrachloride, a dielectric fluid, and ethylene.

12. The cooling device as set forth in claim 1, wherein the stepped face has a profile selected from the group consisting of an arcuate profile and a slopped profile.

13. The cooling device as set forth in claim 1, wherein the vanes are tangentially oriented to a predetermined diameter of a circle centered about the axis.

14. The cooling device as set forth in claim 13, wherein the predetermined diameter is from about 3.0 millimeters to about 12.0 millimeters.

15. The cooling device as set forth in claim 1, wherein the vanes are inclined at an angle with respect to the axis.

16. The cooling device as set forth in claim 15, wherein the angle at which the vanes are inclined is from about 5.0 degrees to about 25.0 degrees.

17. The cooling device as set forth in claim 15, wherein the angle at which the vanes are inclined comprises a first angle from about 10.0 degrees to about 25.0 degrees, the first angle measured along the smooth radially outward portion, and a second angle from about 5.0 degrees to about 18.0 degrees measured along the smooth curved portion.

18. The cooling device as set forth in claim 1, wherein the boss has a profile selected from the group consisting of an arcuate profile and a sloped profile.

19. The cooling device as set forth in claim 1, wherein the primary slot further includes a first arcuate profile along the heat mass and the first arcuate profile is a portion of an arc having a radius from about 38.0 millimeters to about 45.0 millimeters.

20. The cooling device as set forth in claim 1, wherein the secondary slot extends to the heat mass and the secondary slot further includes a second arcuate profile along the heat mass and the second arcuate profile is a portion of an arc having a radius from about 31.0 millimeters to about 38.0 millimeters.

21. The cooling device as set forth in claim 1, wherein the first portion of the inner wall is a sloped surface and the second portion of the inner wall is a concave arcuate surface.

22. The cooling device as set forth in claim 1 and further comprising:
a shroudless fan including a space frame for supporting the fan and for positioning the fan adjacent to the top face and over the chamber so that an air flow generated by the fan produces the air flow through the chamber, the space frame including a plurality of arms that span the top face, the arms include fingers at an end thereof, and the fingers are adapted to clamp the space frame to the smooth radially outward portion of the outer wall.

23. The cooling device as set forth in claim 1, wherein the thermal core has a profile selected from the group consisting of an arcuate profile and a sloped profile.

24. The cooling device as set forth in claim 1 and further comprising:
a plurality of projections connected with and extending outward of a selected one of the mounting surface of the thermal core or the base of the heat mass; and
a thermal interface material in contact with the mounting surface and positioned between the projections.

25. The cooling device as set forth in claim 1, wherein the thermal core and the heat mass are fixedly connected to each other.

26. The cooling device as set forth in claim 1, wherein the heat mass, the base, and the vanes are homogeneously formed.

27. The cooling device as set forth in claim 1, wherein the plug is made from a material selected from the group consisting of aluminum, an aluminum alloy, copper, a copper alloy, an electrolytic copper, gold, a gold alloy, silicon, graphite, a carbon fiber material, a carbon fiber reinforced material, and a ceramic material.

28. A system for dissipating heat, comprising:
a cooling device including:
a heat mass including a base, a chamber bore extending inward of the base, a boss symmetrically positioned about an axis of the heat mass and including a land and a threaded bore extending through the boss to the chamber bore;
a thermal core connected with the base and including a stepped face that extends into the chamber bore and a mounting surface adapted to thermally connect the thermal core and the heat mass with the component;
a plug including a plurality of plug fins that are spaced apart to define a plug slot between adjacent plug fins, a step face, a threaded neck extending from the step face and adapted to be threaded into the threaded bore until the step face is contact with the land, and a plug cavity formed in the threaded neck;
a vapor chamber defined by the plug cavity, the chamber bore, and the stepped face;
a phase change liquid in contact with a portion of the stepped face and sealed in the vapor chamber at a low pressure;
a plurality of vanes connected with the heat mass and spaced apart to define a primary slot therebetween that extends to the heat mass, the vanes have a surface area that increases in a radially outward direction from the axis, the vanes including at least one secondary slot extending through a portion of each vane to define a plurality of fins in each vane,
the vanes including a top face, an aerodynamically profiled inner wall including a first portion extending from the boss and terminating at a second portion that extends to the top face, the inner walls of the vanes defining a chamber that surrounds the boss, an outer wall having a surface profile that widens from the base to the top face and includes therebetween a smooth curved portion, a draft portion, and a smooth radially outward portion; and
wherein heat is dissipated from the component by heat in the thermal core converting the phase change liquid from a liquid state to a vapor state and by an air flow through the chamber, the primary slots, the secondary slots, and the plug slots;
a fan for generating the air flow through the chamber, the fan connected with the top face;
a component including a component face; and
a base mount for urging the mounting surface and the component face into contact with each other so that heat generated by the component is thermally communicated into the cooling device.

29. The system as set forth in claim 28 wherein the component is carried by a support unit selected from the group consisting of a socket, a substrate, and a PC board, and the base mount is removably connected with the support unit.

30. The system as set forth in claim 28 wherein the mounting surface further comprises:
a plurality of projections connected with and extending outward of a selected one of the mounting surface of the thermal core or the base of the heat mass; and
a thermal interface material in contact with the mounting surface and positioned between the projections.

31. The system as set forth in claim 28, wherein the fan is a shroudless fan including a space frame for supporting the fan and for positioning the fan adjacent to the top face and over the chamber so that the air flow generated by the fan produces the air flow into the chamber,
the space frame including a plurality of arms that span the top face, the arms include fingers at an end thereof,
and the fingers are adapted to clamp the space frame to the smooth radially outward portion of the outer wall.

* * * * *